(12) United States Patent
Shirakawa et al.

(10) Patent No.: US 10,117,326 B2
(45) Date of Patent: Oct. 30, 2018

(54) COMMUNICATION DEVICE

(71) Applicant: Hitachi Metals, Ltd., Tokyo (JP)

(72) Inventors: Yohei Shirakawa, Hitachi (JP); Koki Hirano, Hitachinaka (JP); Yoshitake Ageishi, Hitachi (JP); Yuki Haga, Takahagi (JP)

(73) Assignee: HITACHI METALS, LTD., Tokyo (JP)

( * ) Notice: Subject to any disclaimer, the term of this patent is extended or adjusted under 35 U.S.C. 154(b) by 152 days.

(21) Appl. No.: 15/202,935

(22) Filed: Jul. 6, 2016

(65) Prior Publication Data

US 2017/0013706 A1 Jan. 12, 2017

(30) Foreign Application Priority Data

Jul. 7, 2015 (JP) .................................. 2015-136313

(51) Int. Cl.
*H05K 1/02* (2006.01)
*H01P 3/02* (2006.01)
*H01R 13/6467* (2011.01)

(52) U.S. Cl.
CPC ............ *H05K 1/0228* (2013.01); *H01P 3/02* (2013.01); *H01R 13/6467* (2013.01); *H05K 1/0245* (2013.01); *H05K 2201/10189* (2013.01)

(58) Field of Classification Search
CPC ............ H01R 13/6467; H01R 12/6461; H01R 13/6466; H01R 13/6461; H01R 1/6466; H05K 1/0228; H05K 1/0245; H05K 2201/10189; H04B 3/32; H04B 3/34; H01P 3/02; H01P 3/04
USPC .................................................... 333/4, 5, 12
See application file for complete search history.

(56) References Cited

U.S. PATENT DOCUMENTS

2006/0121791 A1* 6/2006 Hashim ................ H05K 1/0228
439/676

FOREIGN PATENT DOCUMENTS

JP      2010-027437 A     2/2010

* cited by examiner

*Primary Examiner* — Rakesh Patel
*Assistant Examiner* — Jorge Salazar, Jr.
(74) *Attorney, Agent, or Firm* — McGinn I.P. Law Group, PLLC.

(57) ABSTRACT

A communication device is provided wherein a number of the pairs of transmission lines is N, each pair of the transmission lines comprises (N−1) stages of sub-transmission lines generating a same amount of crosstalk as that caused at a connector, and (N−1) stages of connecting portions comprise a transmission path of the connector and a first stage sub-transmission line, and (N−1) stages of the connecting portions to connect an i th stage sub-transmission line and an (i+1) th stage sub-transmission line by the straight/cross connection, and wherein each pair of the transmission lines is different in all pairs in a number of the connecting portion having the cross connection; and as a j th stage connecting portion in any one pair of the transmission lines has cross connection, a (N−j) th stage connecting portion in the any one pair of the transmission lines also has cross connection.

7 Claims, 28 Drawing Sheets

COMMUNICATION DEVICE

The present application is based on Japanese patent application No. 2015-136313 filed on Jul. 7, 2015, the entire contents of which are incorporated herein by reference.

BACKGROUND OF THE INVENTION

1. Field of the Invention

The invention relates to a communication device.

2. Description of the Related Art

A communication device is provided with a connector by which a communication cable is connected to the device. For example, a jack connector conforming to the RJ45 standard is used as the connector.

In the connector, as electrodes (terminals) are arranged relatively close to each other, as compared with transmission lines formed on a circuit board, a crosstalk tends to have a significant effect. The crosstalk which is caused at the connector becomes a major problem along with the increasing of communication speed in recent years.

For example, as a method to decrease the crosstalk caused at the connector, a method to exchange alignment of the transmission lines connected to the connector is known.

The arrangement of electrodes in the jack connector used as the connector is standardized by TIA/EIA-568-B defined by American National Standards Institute (ANSI) such that number 1 and number 2 electrodes, number 3 and number 6 electrodes, number 4 and number 5 electrodes, and number 7 and number 8 electrodes are paired respectively.

The communication device is provided with number 1 to number 8 transmission lines corresponding to number 1 to number 8 electrodes. If the transmission lines are arranged in serial order, especially, crosstalk between the pair of number 3 and number 6 transmission lines and the other pairs increases.

Accordingly, by exchanging the arrangement of the transmission lines in the pair of number 3 and number 6 or by exchanging the arrangement of transmission lines in the other pairs than the pair of number 3 and number 6 transmission lines, the crosstalk caused at the connector can be cancelled by the crosstalk caused at the transmission lines so as to decrease the crosstalk.

Further, the prior art document information relevant to the invention may include JP-A-2010-27437.

SUMMARY OF THE INVENTION

The method to exchange the arrangement order of the transmission lines as mentioned above can decrease the crosstalk between the pair of number 3 and number 6 transmission lines and the other pairs. However, there is a problem that between the other pairs, for example, between the pair of number 1 and number 2 transmission lines and the pair of number 4 and number 5 transmission lines the crosstalk may be increased adversely.

As the problem is caused between the pairs which are not adjacent, the problem might be ignorable thus far. However, along with the increasing of clock frequency and the increasing of communication speed by multiplexing in recent years, energy in a 1 bit is decreased and the effect of the crosstalk tends to be increased. Thus, a countermeasure therefor is desired.

It is an object of the invention to provide a communication device that can decrease the crosstalk.

(1) According to an embodiment of the invention, a communication device comprises:

a connector connected a communication cable having multiple pairs of signal lines for transmitting a differential signal; and a plurality of pairs of transmission lines for transmitting the differential signal inputted/outputted through the connector, wherein a number of the pairs of the transmission lines is N (N is even number), each pair of the transmission lines comprises (N−1) stages of sub-transmission lines generating a same amount of crosstalk as that caused at the connector, and (N−1) stages of connecting portions comprise a first stage connecting portion to connect a transmission path of the connector and a first stage sub-transmission line by a straight/cross connection, and second to (N−1) th stage connecting portions to connect an i (i=1 to N−2) th stage sub-transmission line and an (i+1) th stage sub-transmission line by the straight/cross connection, and wherein each pair of the transmission lines is different in all pairs in a number of the connecting portion having the cross connection, and as a j (j=an integer by 1 to N/2) th stage connecting portion in any one pair of the transmission lines has cross connection, a (N−j) th stage connecting portion in the any one pair of the transmission lines also has cross connection.

(2) The communication device may be configured such that the number of the pairs of the transmission lines is four, the four pairs of the transmission lines comprise three stages of the sub-transmission lines and three stages of the connecting portions, a first pair of the transmission lines has straight connection at all of the connecting portions, a second pair of the transmission lines has the cross connection at the second stage connecting portion and the straight connection at the first and the third stage connecting portion, a third pair of the transmission lines has the cross connection at the first and the third stage connecting portions and the straight connection at the second stage connecting portion, and a fourth pair of the transmission lines has the cross connection at all of the connecting portions.

(3) The communication device may be configured such that the four pairs of the transmission lines numbered in serial order comprises number 1 and number 2 transmission lines, number 3 and number 6 transmission lines, number 4 and number 5 transmission lines, and number 7 and number 8 transmission lines, and the pairs composed by number 3 and number 6 transmission lines, and number 4 and number 5 transmission lines are configured so as not to make the cross connection at a same stage connecting portion.

(4) The communication device may be configured such that the pair composed by number 3 and number 6 transmission lines comprises a straight connection at all of the connecting portions.

(5) The communication device may be configured such that it further comprises a capacitance element to rectify an impedance between the two transmission lines configuring of one of the pairs.

(6) The communication device may be configured such that it further comprises a capacitance element to rectify a crosstalk between two of the pairs of the transmission lines.

(7) The communication device may be configured such that it comprises two of the connectors, a circuit board mounting the two of the connectors, and the transmission line formed on the circuit board and connecting each of electrodes corresponding to the two of the connectors, wherein the transmission lines comprise the sub-transmission line and the connecting portion corresponding to the two of the connectors, respectively.

Effects of the Invention

According to an embodiment of the invention, a communication device can be provided that can decrease the crosstalk.

BRIEF DESCRIPTION OF THE DRAWINGS

Next, the present invention will be explained in more detail in conjunction with appended drawings, wherein:

FIGS. 5A and 5B are graphs showing the crosstalk characteristics of the communication device in FIGS. 1A, 1B and FIGS. 3A and 3B and the conventional communication device in FIG. 4A, 4B, wherein FIG. 5A shows far end crosstalk characteristics and FIG. 5B shows near end crosstalk characteristics;

DETAILED DESCRIPTION OF THE PREFERRED EMBODIMENTS

Next, a communication device in a present embodiment according to the invention will be described below with reference to accompanying drawings.

Figure 1A:
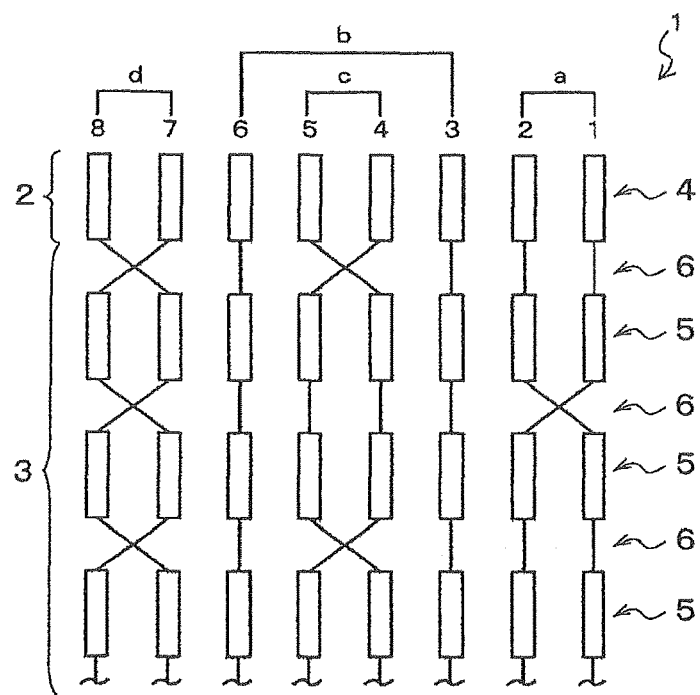
FIG. 1A is an illustration diagram showing a configuration of a transmission line nearby a connector of a communication device in an embodiment according to the invention.

FIG. 1A is an illustration diagram of a configuration of a transmission line nearby a connector in a communication device in an embodiment according to the invention.

Figure 1B:
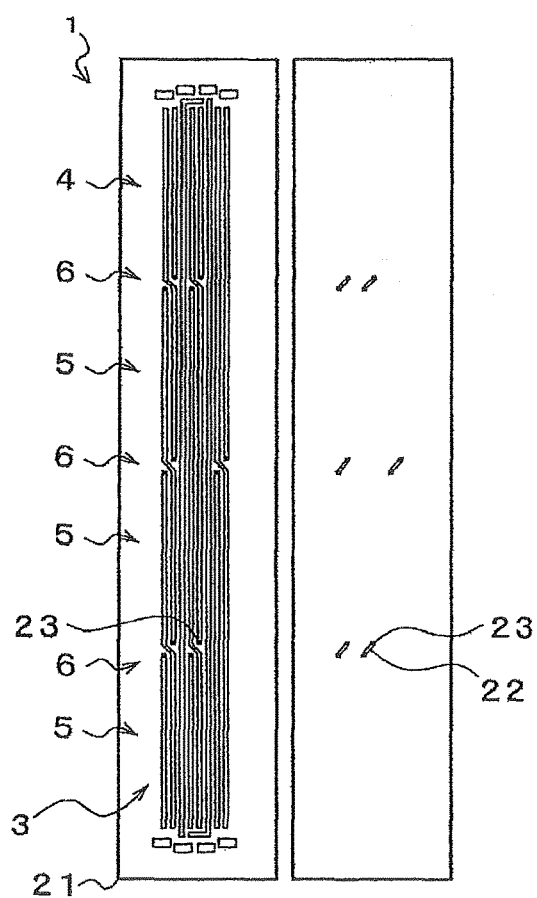
FIG. 1B is a schematic diagram showing an example of a wiring pattern as a transmission line formed on each layer of a circuit board in the communication device.

FIG. 1B is a schematic diagram showing an example of a wiring pattern as a transmission line formed on each layer of a circuit board in the communication device.

As shown in FIG. 1A and FIG. 1B, a communication device 1 comprises a connector 2 connected a communication cable (not shown) having multiple pairs of signal lines to transmit a differential signal, and a plurality of pairs of transmission lines 3 to transmit the differential signal input/output through the connector 2.

A general-purpose LAN (Local Area Network) cable can be adopted as the communication cable. In the present embodiment, the general-purpose LAN cable having four pairs (i.e. totally eight) of the signal lines to transmit the differential signal is adopted as the communication cable.

The connector 2 is, for example, a jack connector conforming to RJ45 standard, and configured so as to be connectable with a connector arranged at an end of the communication cable (e.g. a plug connector conforming to RJ45 standard). The connector 2 comprises eight electrodes (terminals) corresponding to the eight signal lines in the communication cable.

Figure 2A:
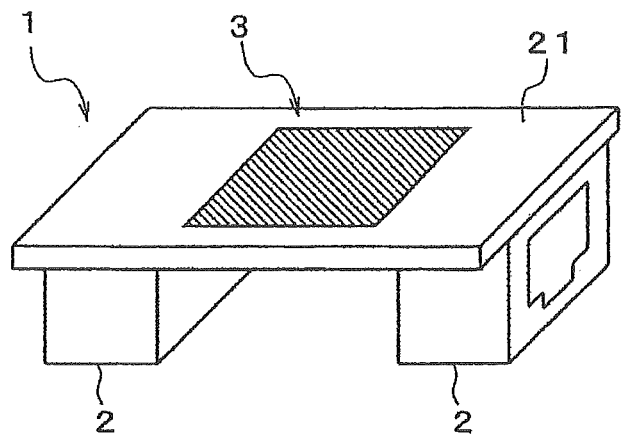
FIG. 2A is a perspective view showing an example of the communication device.
Figure 2B:
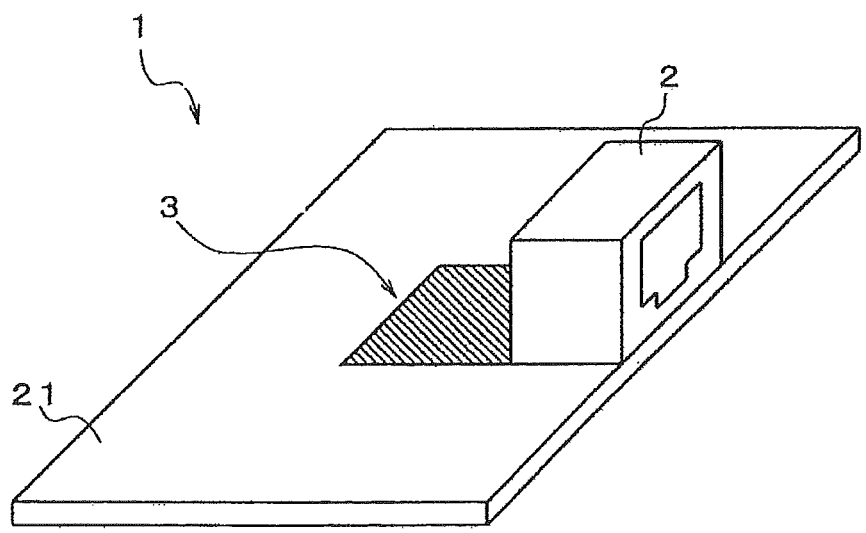
FIG. 2B is a perspective view showing the other example of the communication device.

As shown in FIG. 2A and FIG. 2B, the connector 2 is mounted on a circuit board 21. The transmission line 3 is formed by a wiring pattern formed on the circuit board 21. In this embodiment, four pairs (i.e. totally eight) of the transmission lines 3 corresponding to the four pairs of the signal lines in the communication cable are formed on the circuit board 21. The communication device 1 may be a relay connector to connect the communication cables each other, comprising the two connectors 2, the circuit board 21 mounting the two connectors 2, and the transmission line 3 connecting each electrode corresponding to the two connectors 2 mounted on the circuit board 21.

Moreover, shown in FIG. 2B, the communication device 1 may comprise the connector 2, the circuit board 21 mounting the connector 2, and the transmission line 3 connecting the electrode corresponding to the connector 2 mounted on the circuit board 21, and may be, for example, a communication device likewise a network switch or a server.

Further, a hatched area in FIG. 2A and FIG. 2B shows sub-transmission lines 5 and connecting portions 6 to be described later.

Returning to FIG. 1A, the electrodes in the connector 2 having eight electrodes are numbered in serial which are standardized as TIA/EIA-568-B by ANSI. Number 1 and number 2 electrodes, number 3 and number 6 electrodes, number 4 and number 5 electrodes, and number 7 and number 8 electrodes are paired, respectively. Hereinafter, the pair composed by number 1 and number 2 electrodes is defined as Pair a, the pair composed by number 3 and number 6 electrodes is defined as Pair b, the pair composed by number 4 and number 5 electrodes is defined as Pair c, and the pair composed by number 7 and number 8 electrodes is defined as Pair d. In FIG. 1A, transmission paths including each electrode in the connector 2 are shown as connector transmission paths 4 at uppermost.

Furthermore, In FIG. 1A, numbers 1 to 8 numbered at an upper of the connector transmission path 4 means numbers of the electrodes.

Incidentally, in the communication device 1 according to the present embodiment, as a number of pairs of the transmission lines 3 defines N (N is even number), each pair of the transmission lines 3 comprise sub-transmission lines 5 having N−1 stages, and a connecting portion 6 having N−1 stages.

In the present embodiment, as the number of the pairs of the transmission lines 3 is four, the four pairs of the transmission line 3 comprise the sub-transmission lines 5 having three stages, and the connecting portions 6 having three stages. For example, in the case of the communication device 1 having the two connectors 2 as with the relay connector shown in FIG. 2A, the communication device 1 comprises the sub-transmission lines 5 having three stages, and the connecting portions 6 having three stages. Also in case of applying to a network switch or a server, having multiple ports, the sub-transmission lines 5 having three stages, and the connecting portions 6 having three stages are comprised with respect to each of the ports (the connector 2).

Each of the sub-transmission lines 5 is aligned so as to apply same quantity crosstalk with crosstalk caused at the connector 2. In this case, as each of the sub-transmission lines 5 are configured by linear wiring pattern, a specific shape of the sub-transmission line 5 is not limited thereto. Shown FIG. 1A, a first stage of the sub-transmission line 5, a second stage of it, and a third stage of it are arranged in this order from the side of the connector transmission line 4.

The connecting portion 6 comprises a first stage connecting portion 6 connecting between the connector transmission path 4 and a first stage sub-transmission line 5 by a straight/cross connection, and second to N−1 stage connecting portions 6 connecting between an i (i=1 to N−2) th stage sub-transmission line 5 and an i+1 th stage sub-transmission line 5 by a straight connection/cross connection. The connecting portion 6 comprises N−1 (three stages in the present embodiment) stages totally. Further, the cross connection means a connection with exchanging an arrangement between the two transmission lines 3 (sub-transmission line 5) which configure a pair, and the straight connection means a connection without exchanging an arrangement between the two transmission lines 3 (sub-transmission line 5) which configure a pair.

Each pair of the transmission lines 3 is different to a number of the connecting portions 6 having the cross connection. Thus, as the communication device 1 comprises N pairs of the transmission lines 3, each number of the connecting portions 6 having the cross connection is arranged in 0, 1, 2 . . . N−1 respectively.

Moreover, as any one pair of the transmission lines 3 make the cross connection at a j (j means any integer between 1 to N/2) th stage connecting portion 6, the communication device 1 is configured such as the any one pair of the transmission lines 3 make the cross connection at a (N−j) th stage connecting portion 6. That is, the cross connection is arranged at the connecting portions 6 which is located at vertical symmetry about N/2 th stage connecting portion 6.

In the present embodiment, as the number of the pairs of the transmission lines 3 is four, the first one of the four pairs of the transmission lines 3 (Pair b in FIGS. 1A, 1B) has the straight connection at all of the connecting portions 6, the second one of the four pairs of the transmission lines 3 (Pair b in FIGS. 1A, 1B) has the cross connection at the second stage connecting portion 6 and the straight connection at the first and third stage connecting portion 6. The third one of the four pairs of the transmission lines 3 (Pair c in FIGS. 1A, 1B) has the cross connection at the first and third stage connecting portions 6 and the straight connection at the second stage connecting portion 6. The fourth one of the four pairs of the transmission lines 3 (Pair d in FIGS. 1A, 1B) has the cross connection at the all stage connecting portions 6.

Accordingly, shown in FIGS. 1A, 1B, a number of the cross connection in Pair b is zero, the number of the cross connection in Pair a is one, the number of the cross connection in Pair c is two, the number of the cross connection in Pair d is three, and the cross connections are arranged at vertical symmetrical positions about the second stage connecting portion 6.

In the present embodiment, making cross connection in the connecting portion 6, such as shown in FIG. 1B, a multi-layers base is adopted to the circuit board 21, and a part of wire 22 to make the cross connection is formed on the other layer without the sub-transmission line 5, and the cross connection is configured so as to connect the sub-transmission line 5 and the wire 22 through a through hole 32.

Figure 3A:
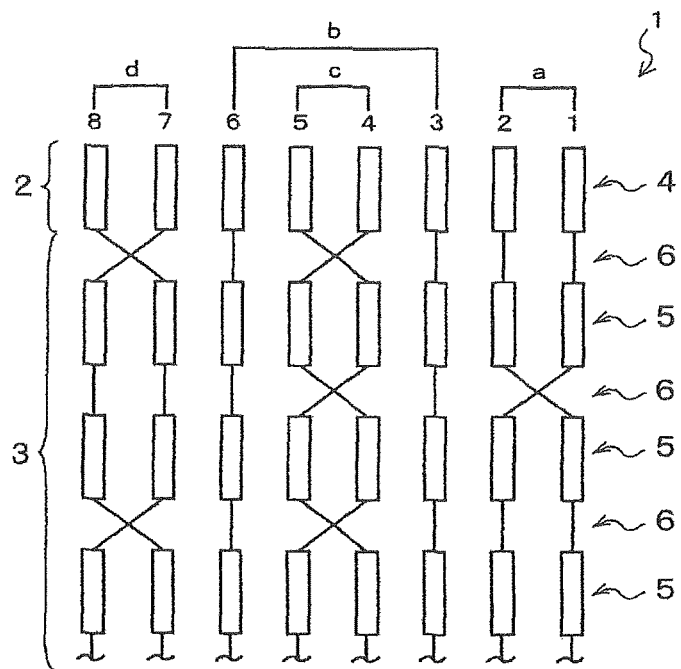
FIG. 3A is an illustration diagram showing a configuration of a transmission line nearby a connector in a communication device in a modified embodiment according to the invention.
Figure 3B:
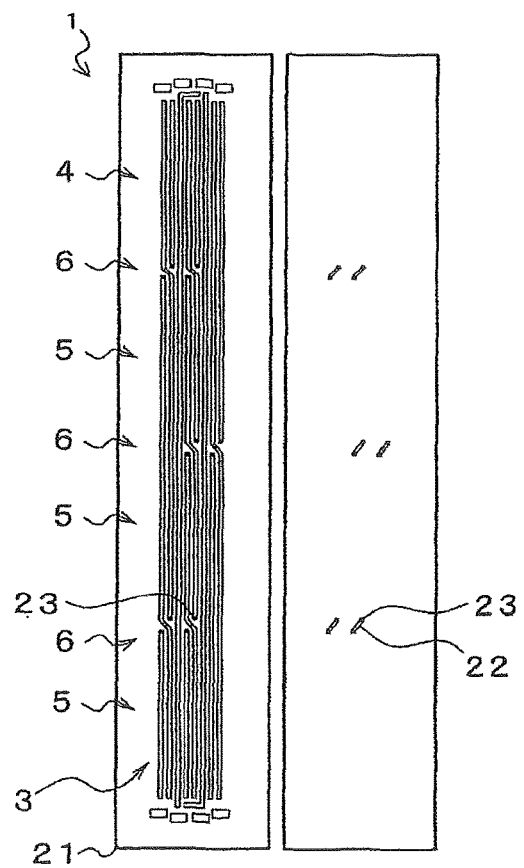
FIG. 3B is a schematic diagram showing an example of a wiring pattern as a transmission line formed on each layer of a circuit board in the communication device.

Further, in the present embodiment, although the numbers of the cross connection in Pair a is one, in Pair b is zero, in Pair c is two, and in Pair d is three, for example shown in FIGS. 3A, 3B, the numbers of the cross connection can be set one in Pair a, zero in Pair b, three in Pair c, and two in Pair d.

Figure 4A:
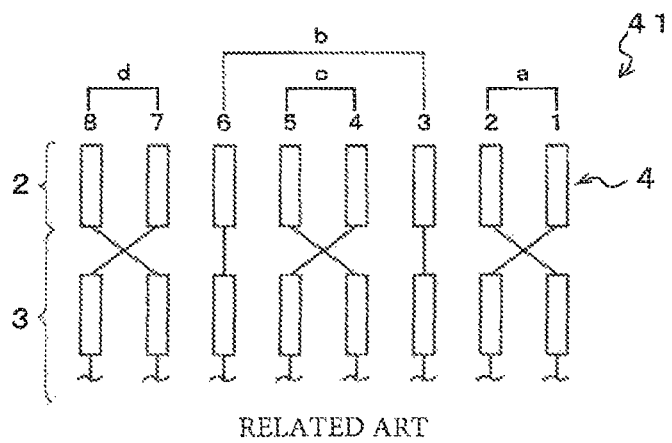
FIG. 4A is an illustration diagram showing a configuration of a transmission line nearby a connector of a conventional communication device for comparison with the present invention.
Figure 4B:
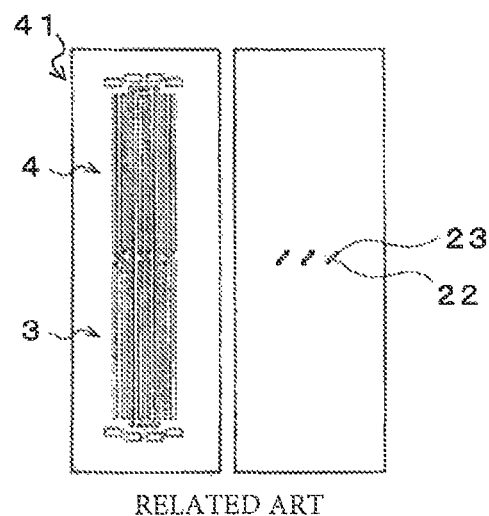
FIG. 4B is a schematic diagram showing an example of a wiring pattern as a transmission line formed on each layer of a circuit board in the conventional communication device.

Far end crosstalk (FEXT) and near end crosstalk (NEXT) in the communication device 1 shown in FIGS. 1A, 1B and FIGS. 3A, 3B are calculated by using a simulation. And far end crosstalk (FEXT) and near end crosstalk (NEXT) in a conventional communication device 41 which is exchanged an arrangement of a transmission lines 3 among Pair a, c, and d shown in the FIGS. 4A, 4B are calculated by using the simulation. Results of the simulations are shown in FIG. 5A and FIG. 5B together.

Figure 5A:
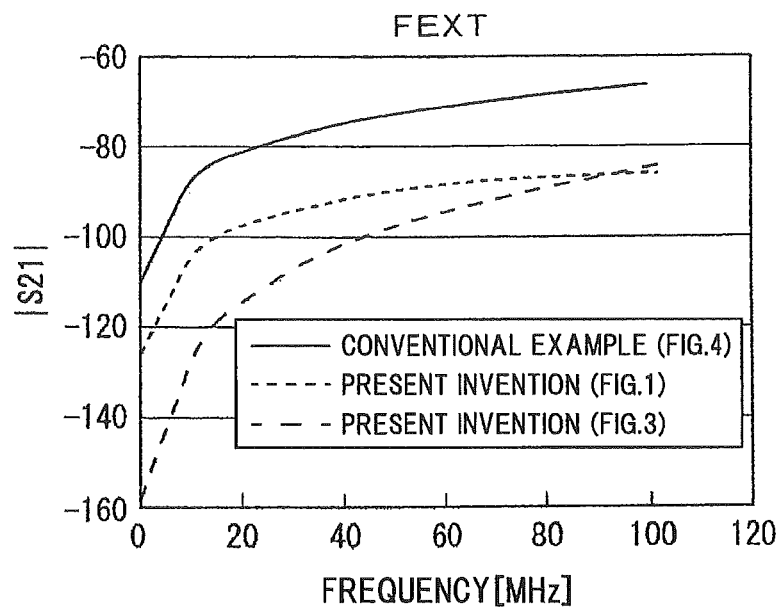
Figure 5B:
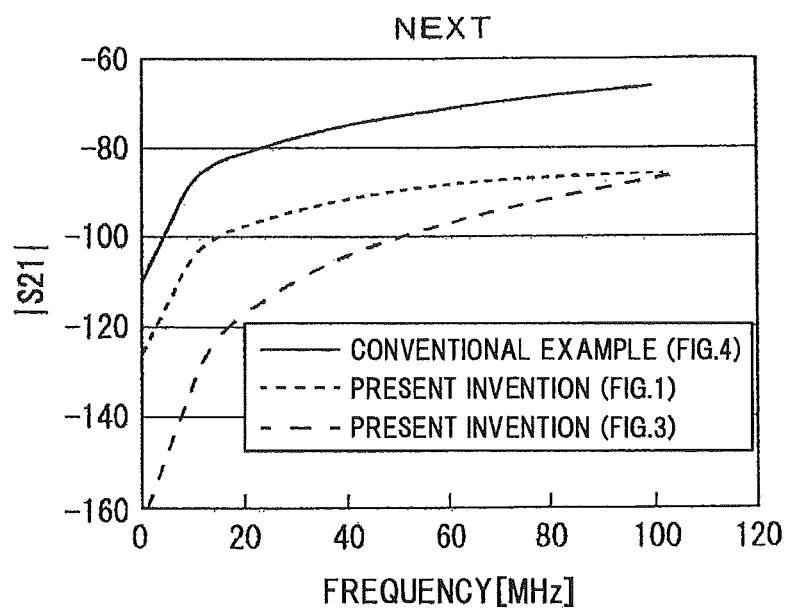
Figure 6A:
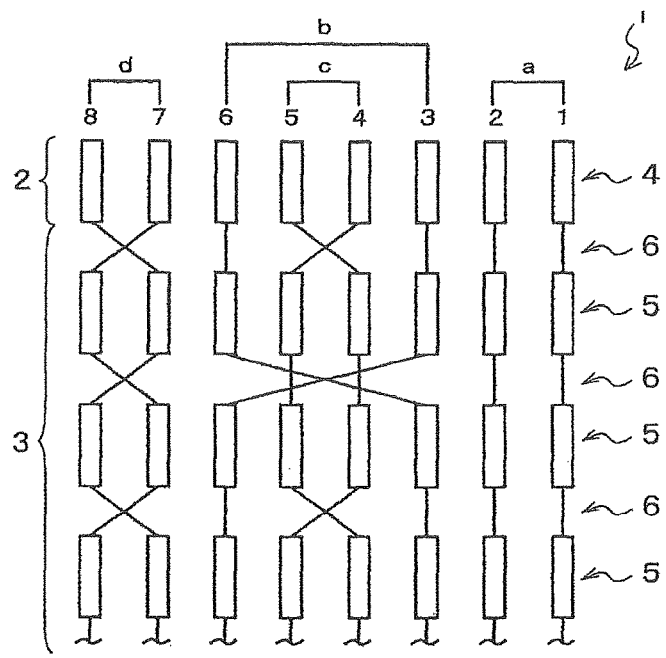
FIG. 6A is an illustration diagram showing a configuration of a transmission line nearby a connector in a communication device in a modified embodiment according to the invention.
Figure 6B:
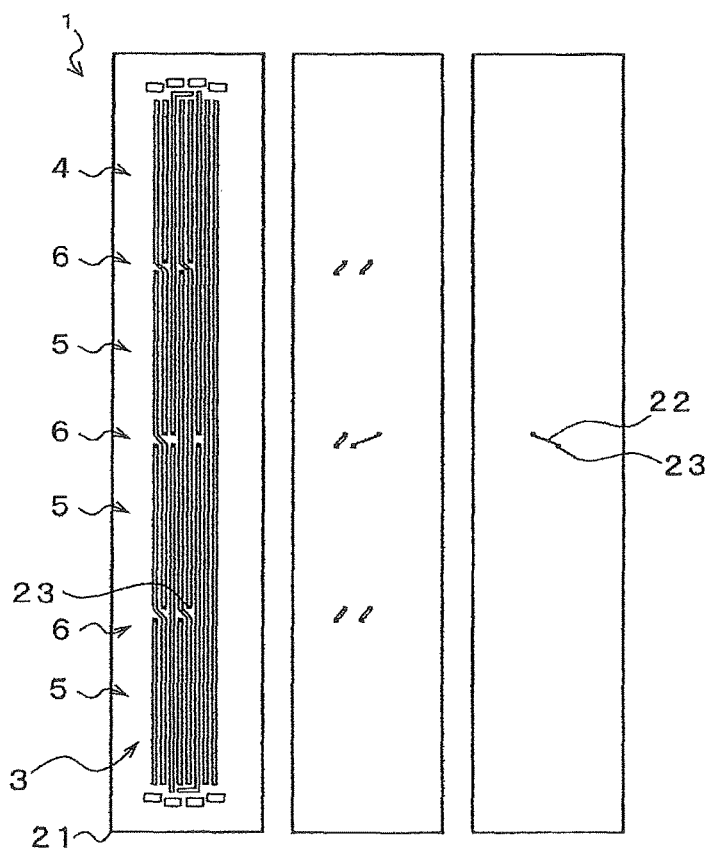
FIG. 6B is a schematic diagram showing an example of a wiring pattern as a transmission line formed on each layer of a circuit board in the communication device.
Figure 7A:
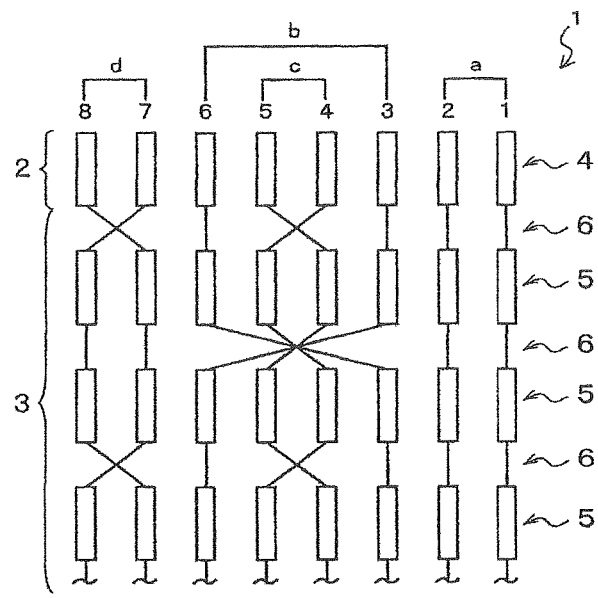
FIG. 7A is an illustration diagram showing a configuration of a transmission line nearby a connector in a communication device in a modified embodiment according to the invention.
Figure 7B:
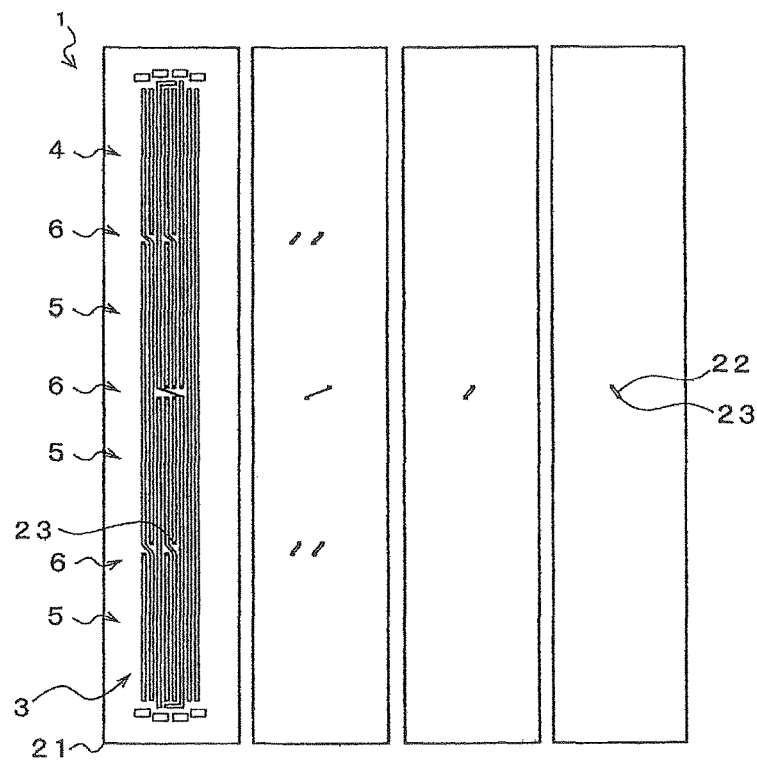
FIG. 7B is a schematic diagram showing an example of a wiring pattern as a transmission line formed on each layer of a circuit board in the communication device.
Figure 8A:
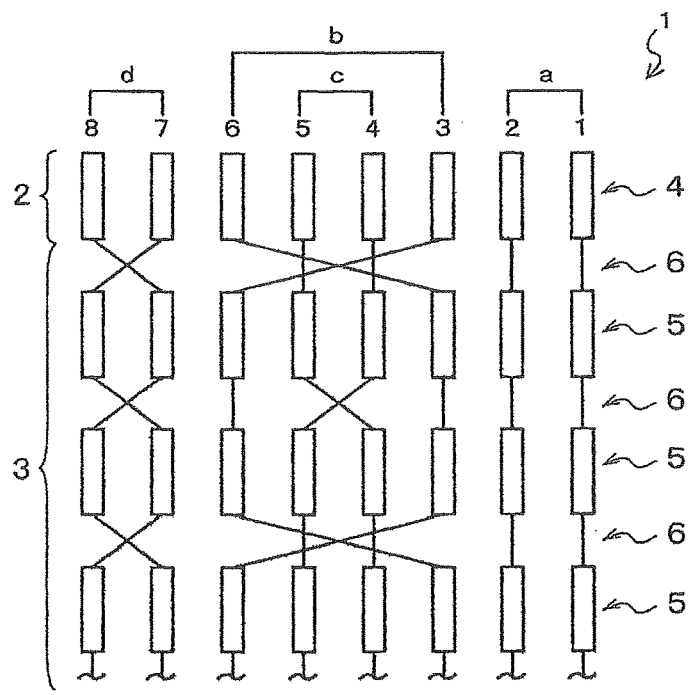
FIG. 8A is an illustration diagram showing a configuration of a transmission line nearby a connector in a communication device in a modified embodiment according to the invention.
Figure 8B:
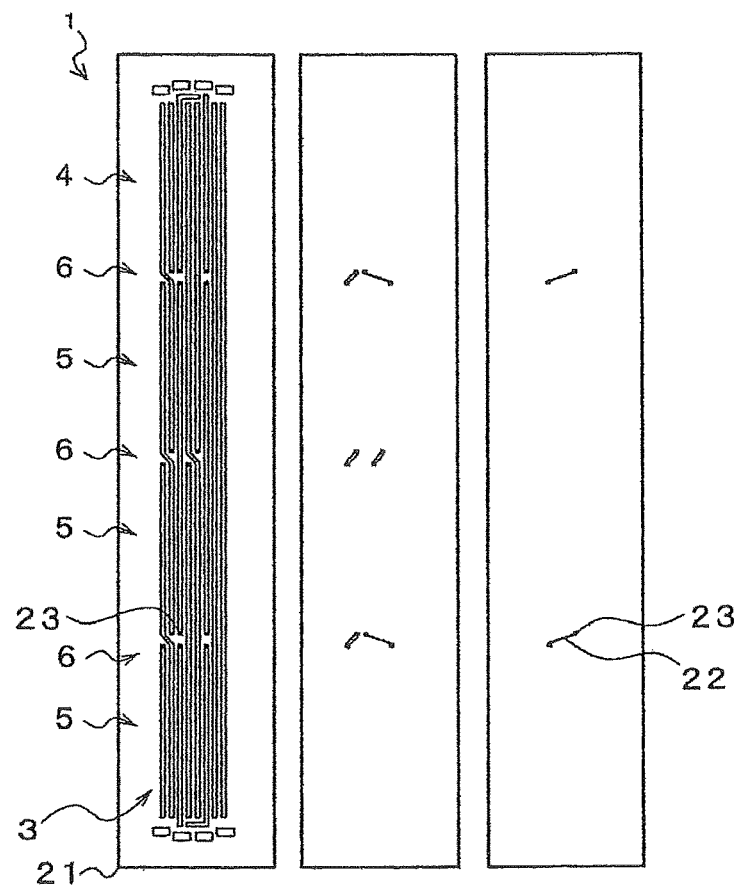
FIG. 8B is a schematic diagram showing an example of a wiring pattern as a transmission line formed on each layer of a circuit board in the communication device.
Figure 9A:
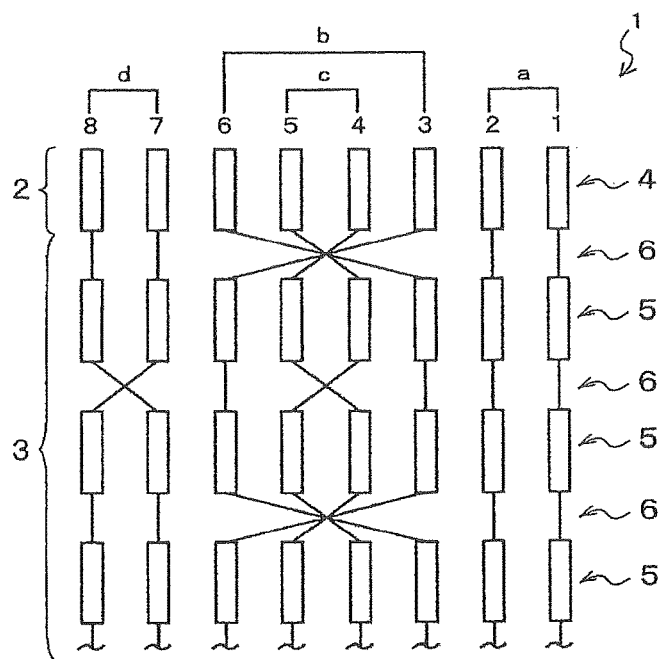
FIG. 9A is an illustration diagram showing a configuration of a transmission line nearby a connector in a communication device in a modified embodiment according to the invention.
Figure 9B:
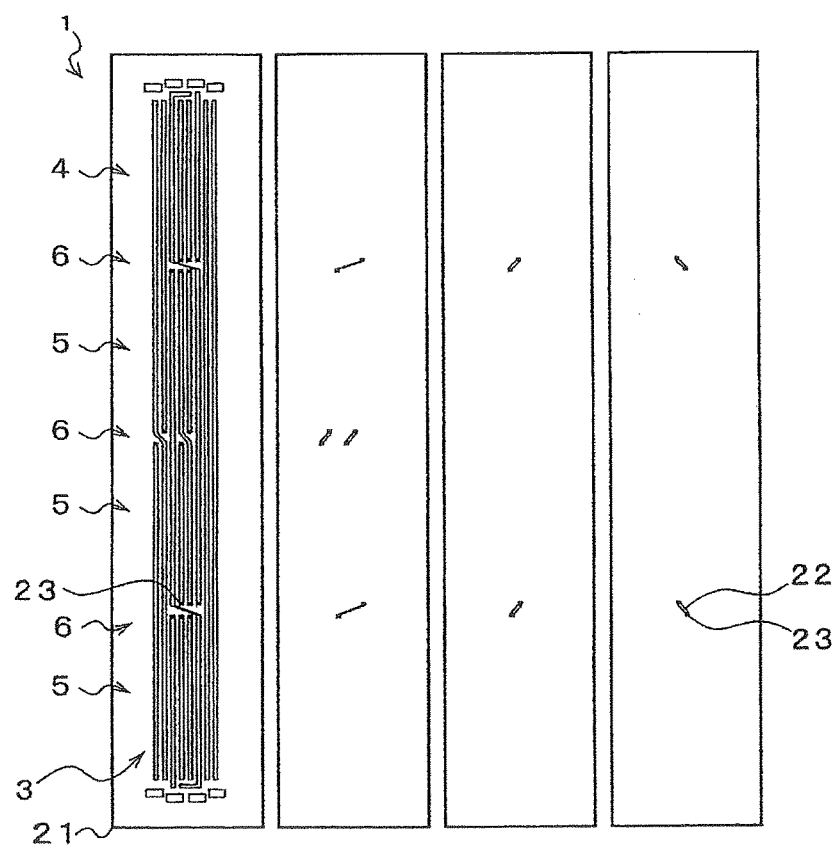
FIG. 9B is a schematic diagram showing an example of a wiring pattern as a transmission line formed on each layer of a circuit board in the communication device.
Figure 10A:
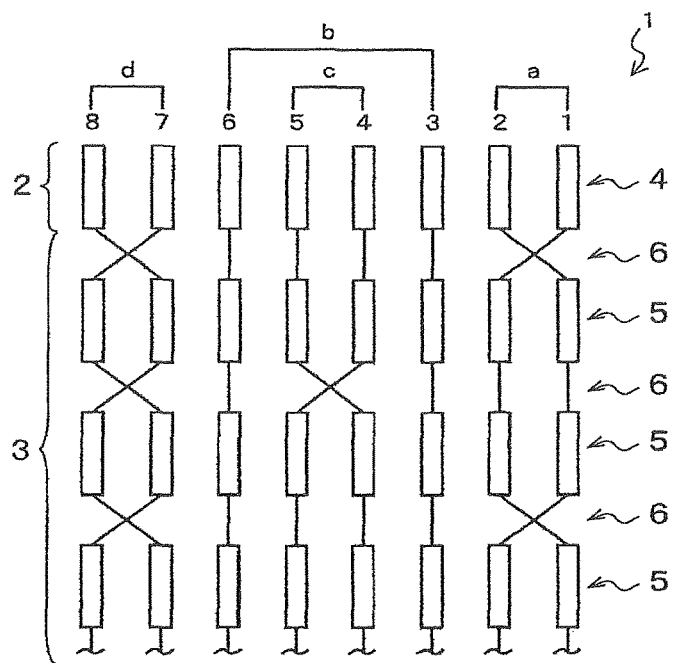
FIG. 10A is an illustration diagram showing a configuration of a transmission line nearby a connector in a communication device in a modified embodiment according to the invention.
Figure 10B:
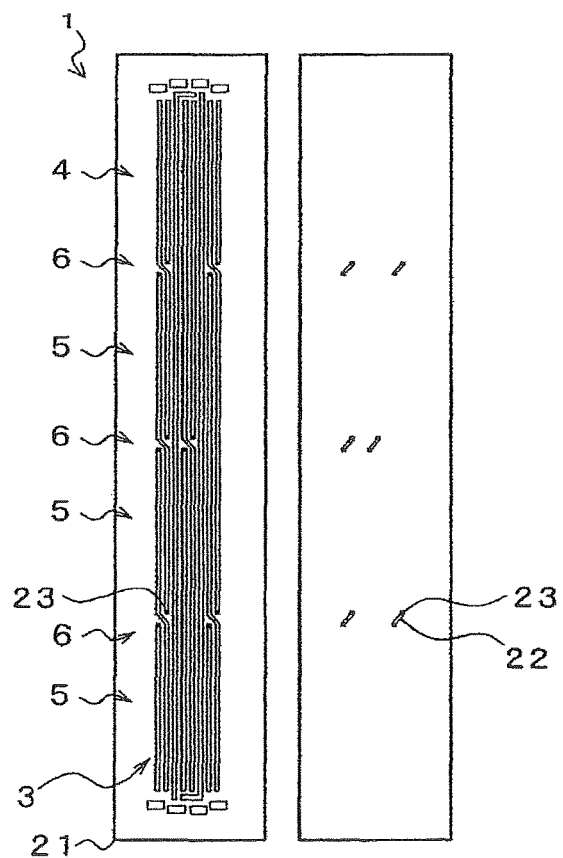
FIG. 10B is a schematic diagram showing an example of a wiring pattern as a transmission line formed on each layer of a circuit board in the communication device.
Figure 11A:
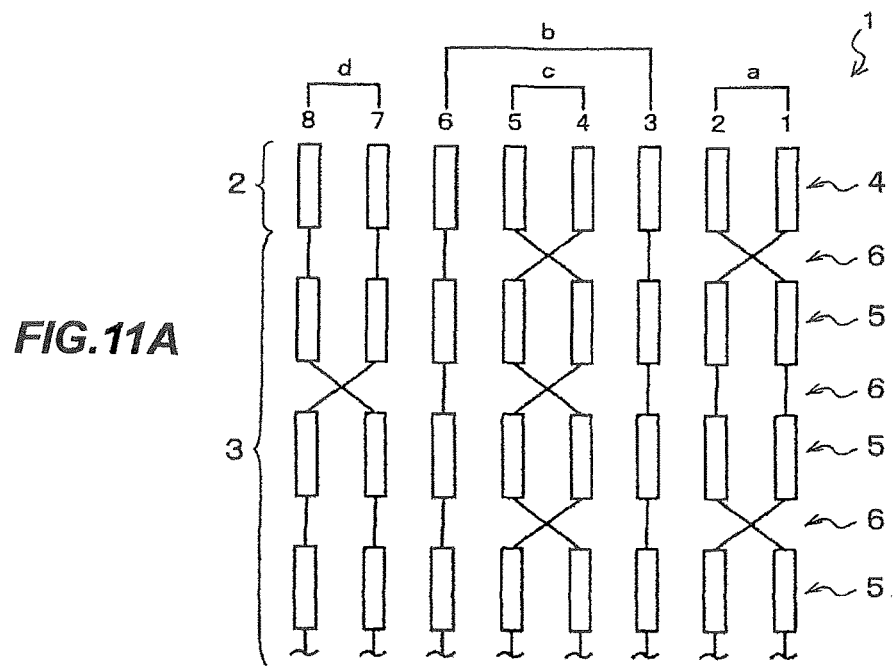
FIG. 11A is an illustration diagram showing a configuration of a transmission line nearby a connector in a communication device in a modified embodiment according to the invention.
Figure 11B:
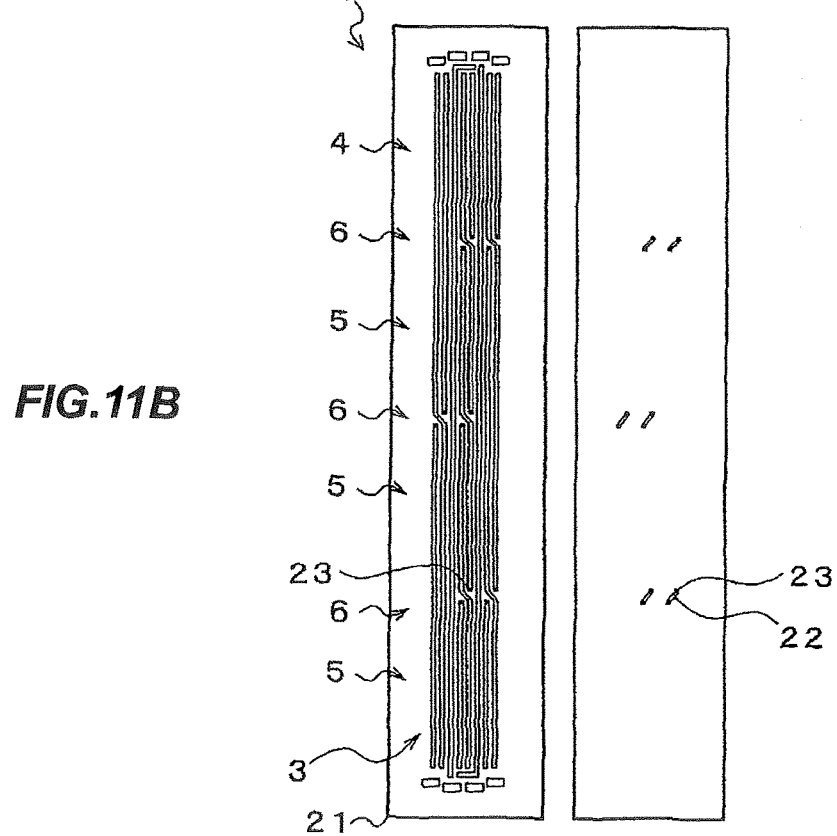
FIG. 11B is a schematic diagram showing of an example of a wiring pattern as a transmission line formed on each layer of a circuit board in the communication device.
Figure 12A:
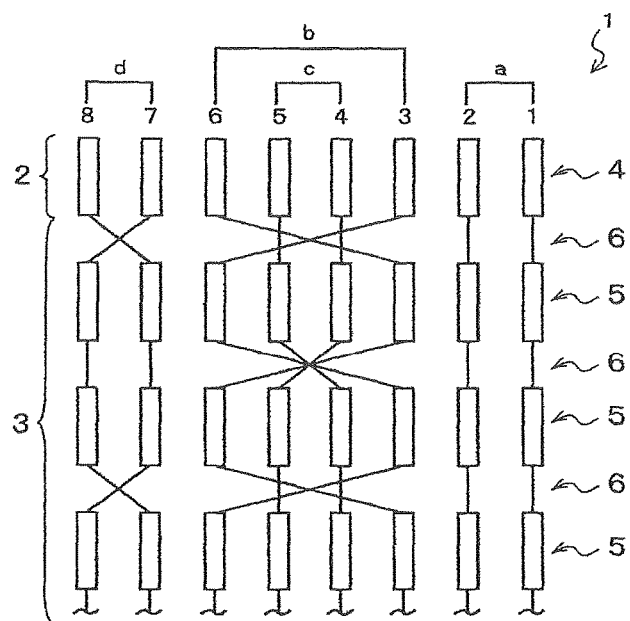
FIG. 12A is an illustration diagram showing a configuration of a transmission line nearby a connector in a communication device in a modified embodiment according to the invention.
Figure 12B:
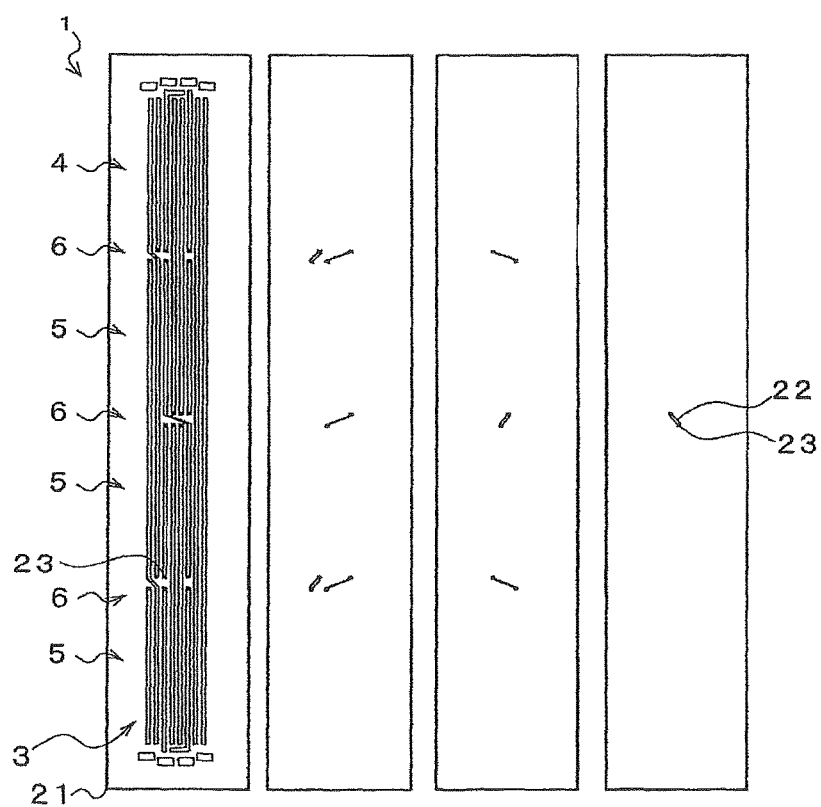
FIG. 12B is a schematic diagram showing an example of a wiring pattern as a transmission line formed on each layer of a circuit board in the communication device.
Figure 13A:
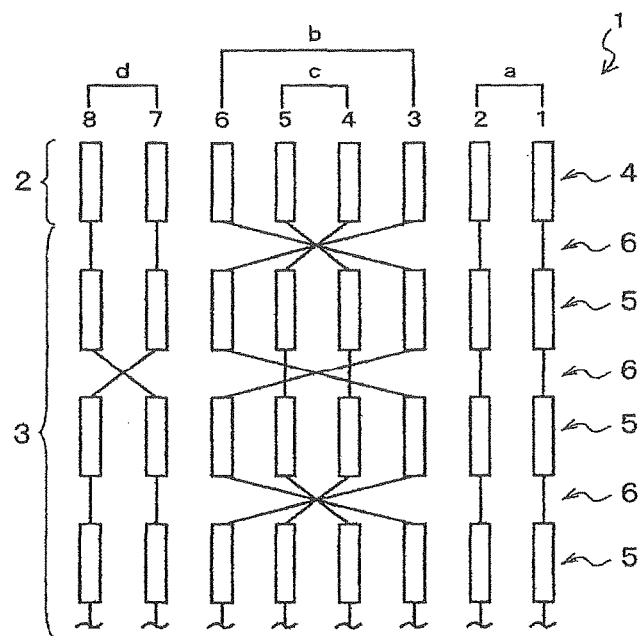
FIG. 13A is an illustration diagram showing a configuration of a transmission line nearby a connector in a communication device in a modified embodiment according to the invention.
Figure 13B:
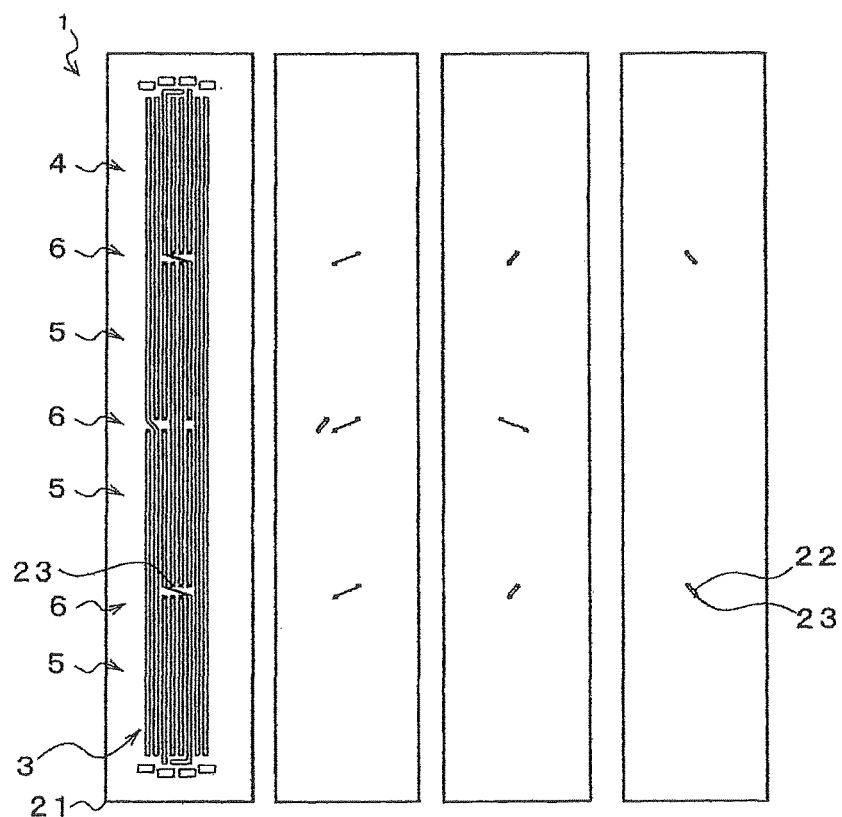
FIG. 13B is a schematic diagram showing an example of a wiring pattern as a transmission line formed on each layer of a circuit board in the communication device.
Figure 14A:
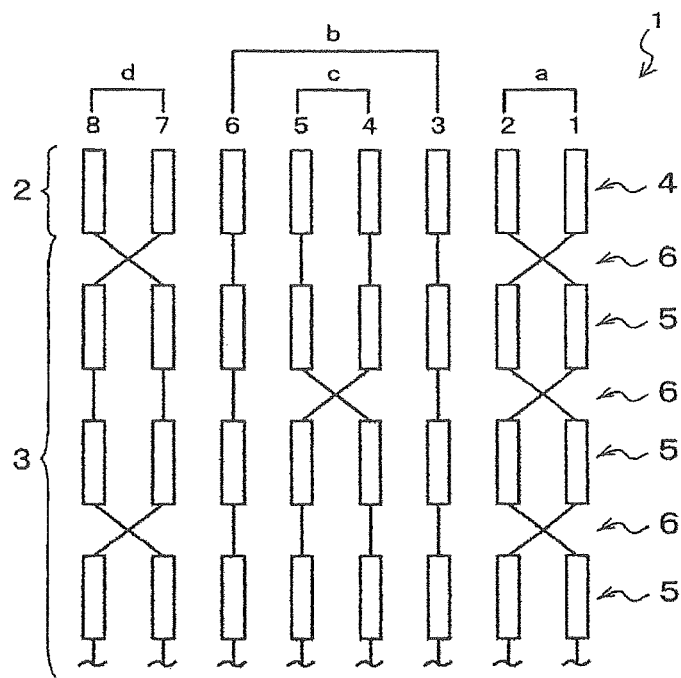
FIG. 14A is an illustration diagram showing a configuration of a transmission line nearby a connector in a communication device in a modified embodiment according to the invention.
Figure 14B:
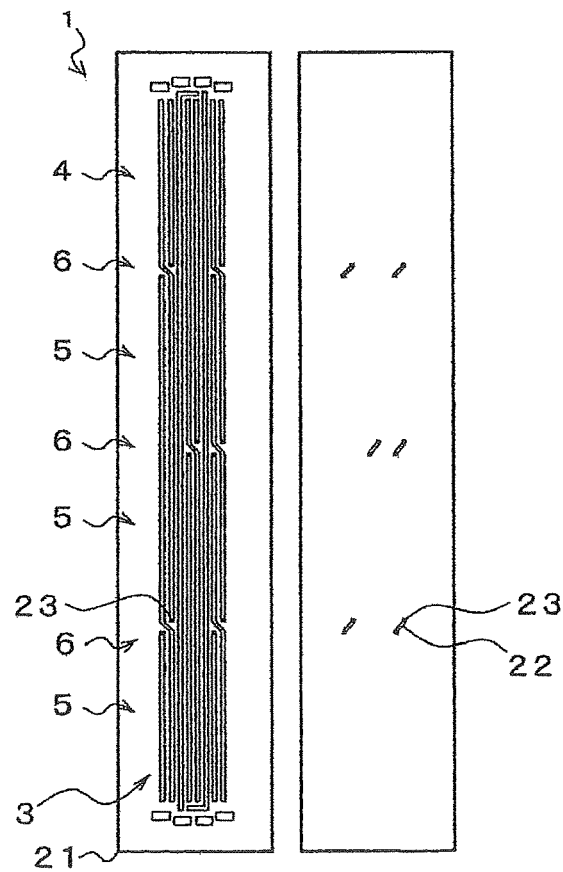
FIG. 14B is a schematic diagram showing an example of a wiring pattern as a transmission line formed on each layer of a circuit board in the communication device.
Figure 15A:
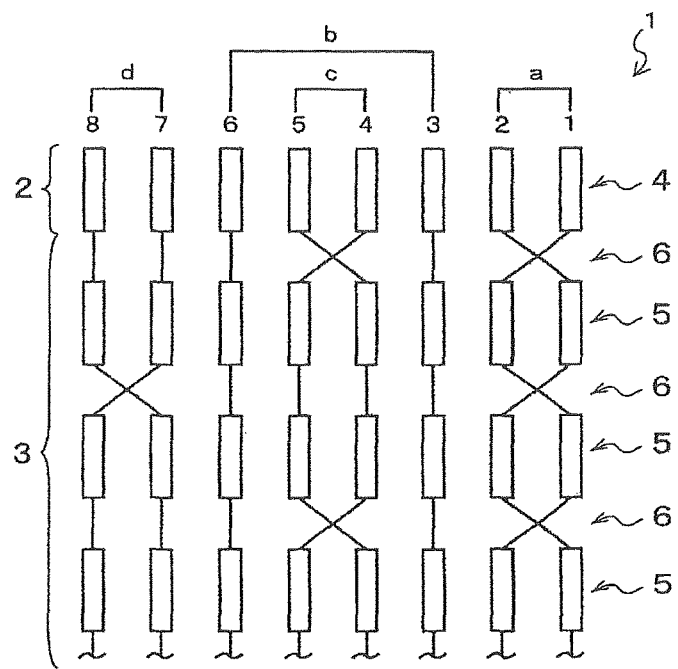
FIG. 15A is an illustration diagram showing a configuration of a transmission line nearby a connector in a communication device in a modified embodiment according to the invention.
Figure 15B:
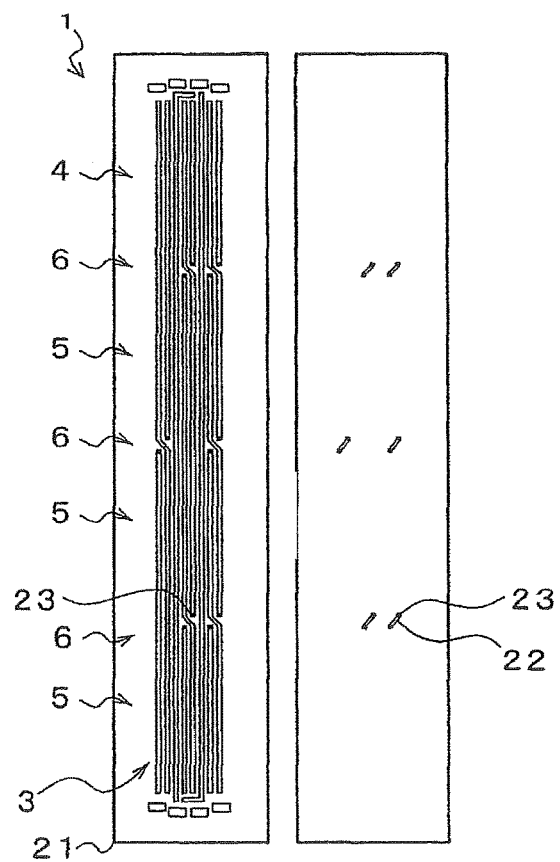
FIG. 15B is a schematic diagram showing an example of a wiring pattern as a transmission line formed on each layer of a circuit board in the communication device.
Figure 16A:
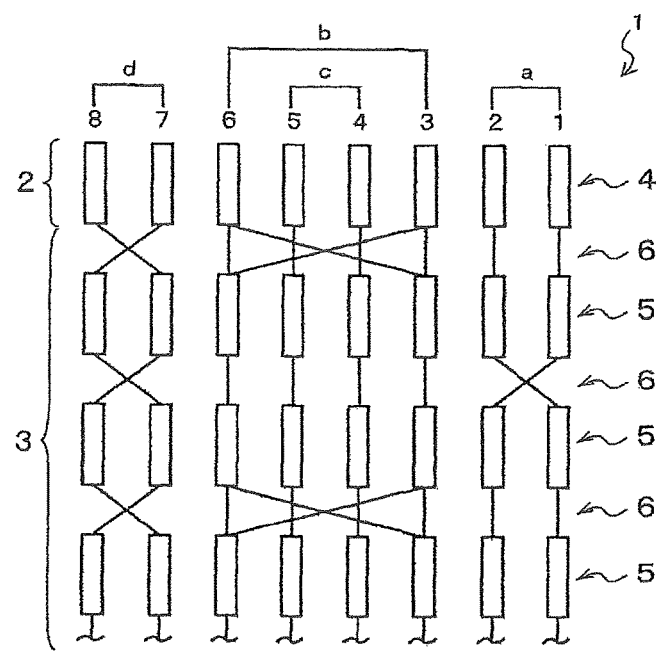
FIG. 16A is an illustration diagram showing a configuration of a transmission line nearby a connector in a communication device in a modified embodiment according to the invention.
Figure 16B:
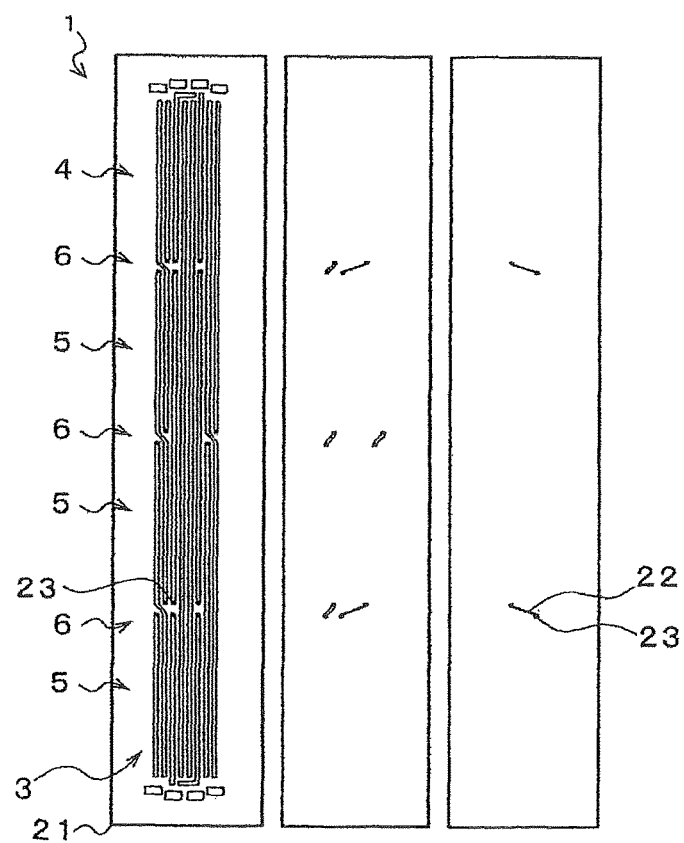
FIG. 16B is a schematic diagram an example of a wiring pattern as a transmission line formed on each layer of a circuit board in the communication device.
Figure 17A:
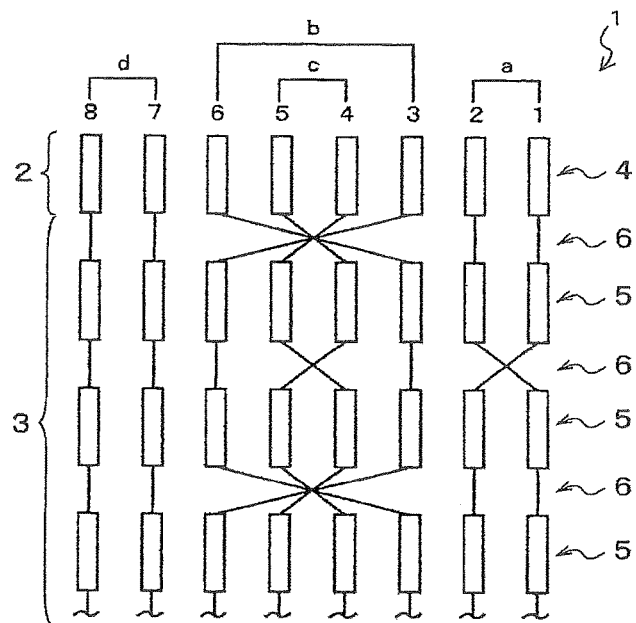
FIG. 17A is an illustration diagram showing a configuration of a transmission line nearby a connector in a communication device in a modified embodiment according to the invention.
Figure 17B:
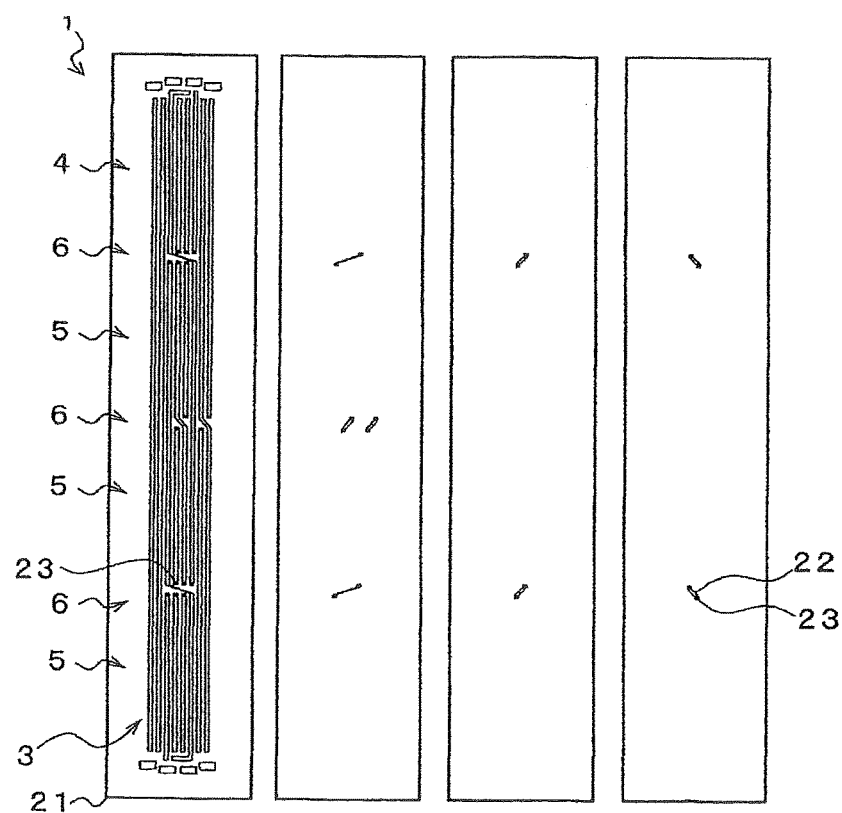
FIG. 17B is a schematic diagram showing an example of a wiring pattern as a transmission line formed on each layer of a circuit board in the communication device.
Figure 18A:
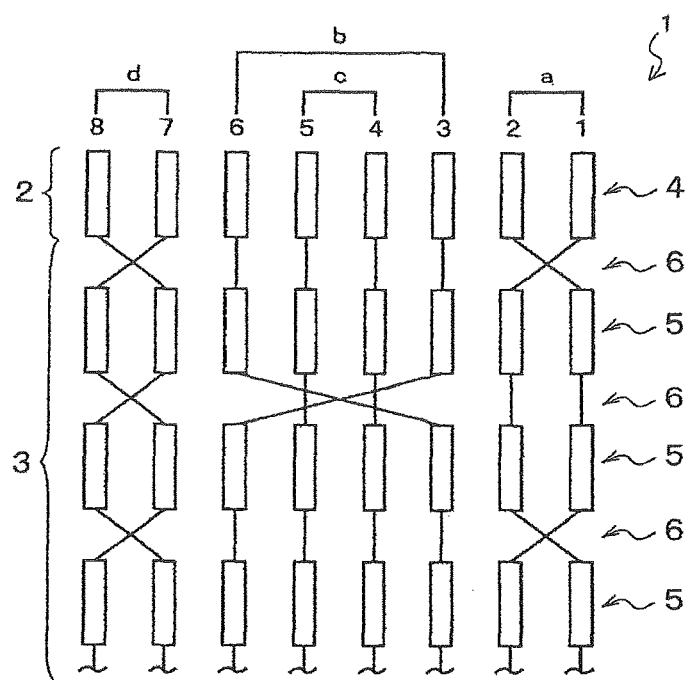
FIG. 18A is an illustration diagram showing a configuration of a transmission line nearby a connector in a communication device in a modified embodiment according to the invention.
Figure 18B:
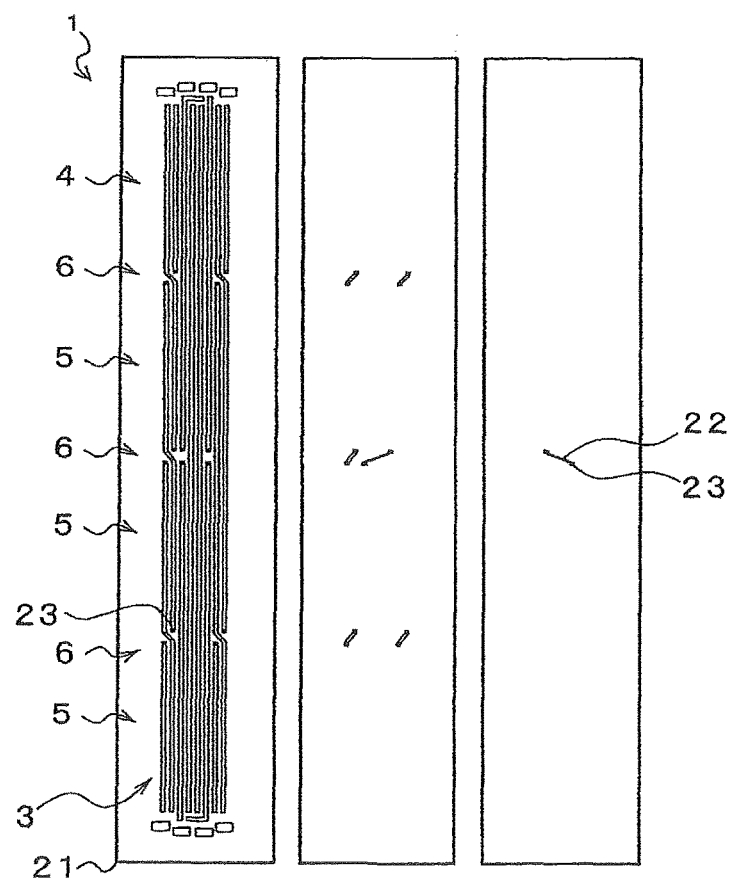
FIG. 18B is a schematic diagram showing an example of a wiring pattern as a transmission line formed on each layer of a circuit board in the communication device.
Figure 19A:
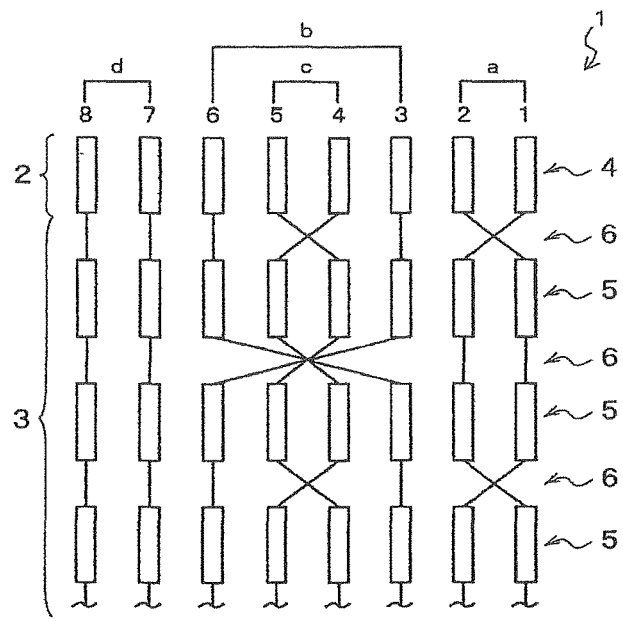
FIG. 19A is an illustration diagram showing a configuration of a transmission line nearby a connector in a communication device in a modified embodiment according to the invention.
Figure 19B:
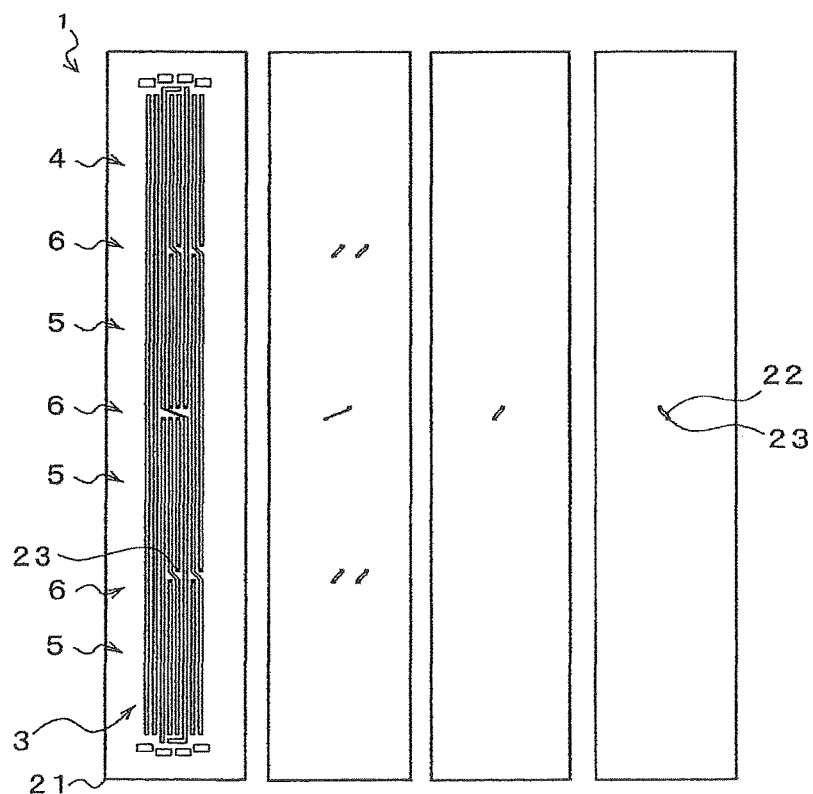
FIG. 19B is a schematic diagram showing an example of a wiring pattern as a transmission line formed on each layer of a circuit board in the communication device.
Figure 20A:
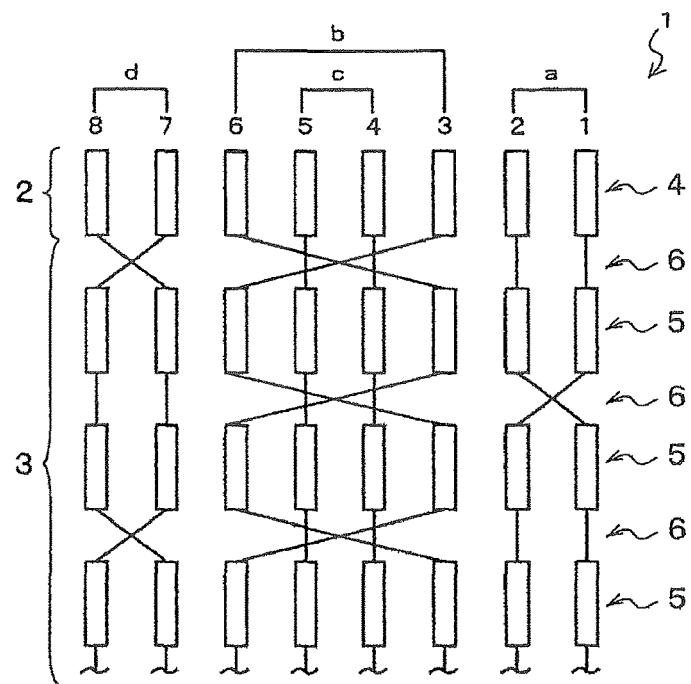
FIG. 20A is an illustration diagram showing a configuration of a transmission line nearby a connector in a communication device in a modified embodiment according to the invention.
Figure 20B:
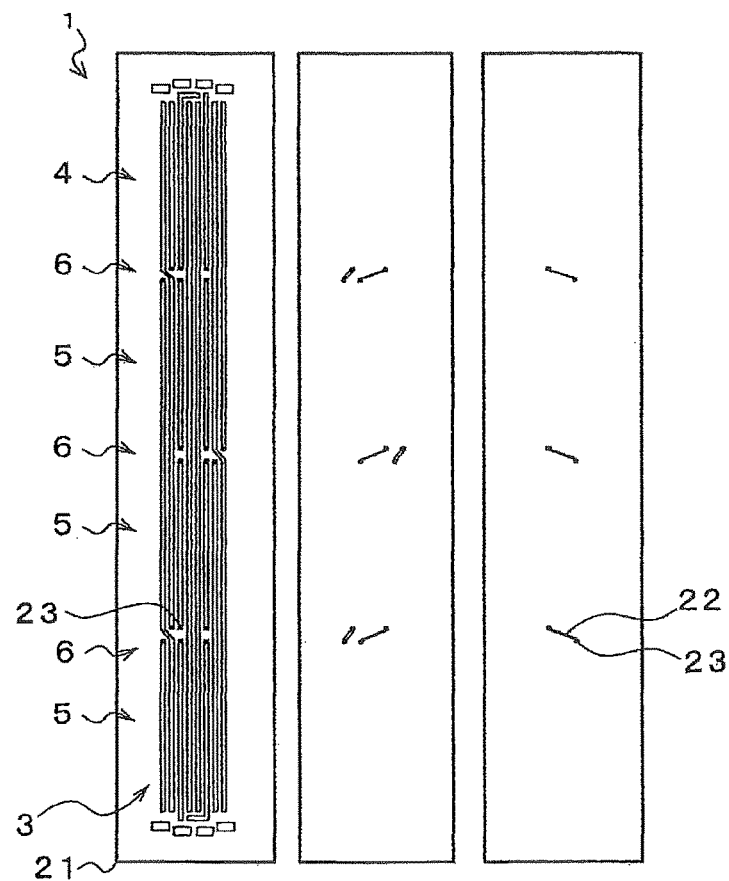
FIG. 20B is a schematic diagram showing an example of a wiring pattern as a transmission line formed on each layer of a circuit board in the communication device.
Figure 21A:
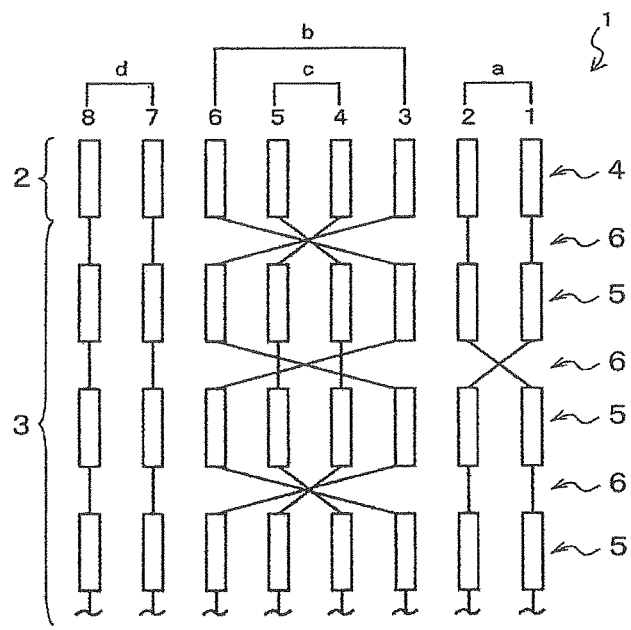
FIG. 21A is an illustration diagram showing a configuration of a transmission line nearby a connector in a communication device in a modified embodiment according to the invention.
Figure 21B:
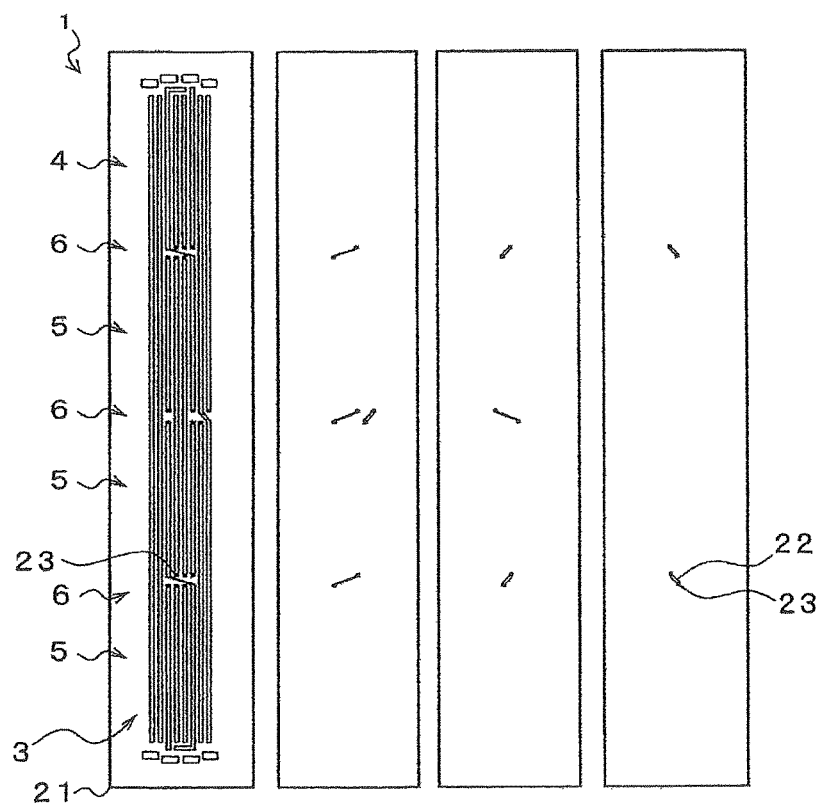
FIG. 21B is a schematic diagram showing an example of a wiring pattern as a transmission line formed on each layer of a circuit board in the communication device.
Figure 22A:
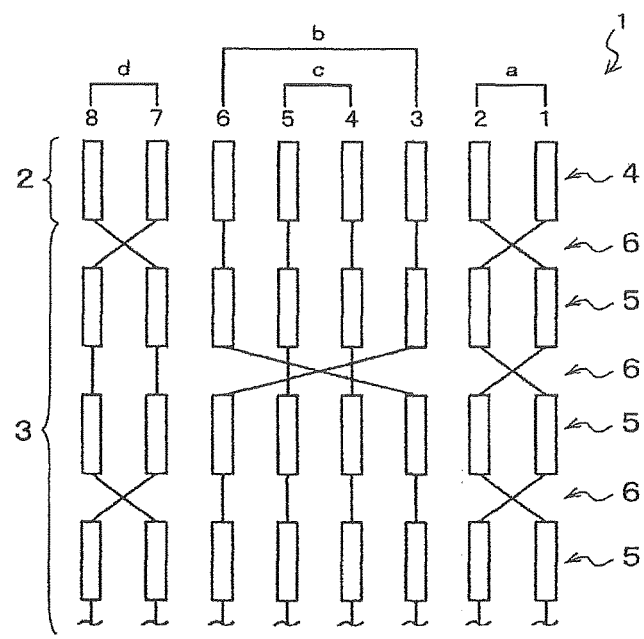
FIG. 22A is an illustration diagram showing a configuration of a transmission line nearby a connector in a communication device in a modified embodiment according to the invention.
Figure 22B:
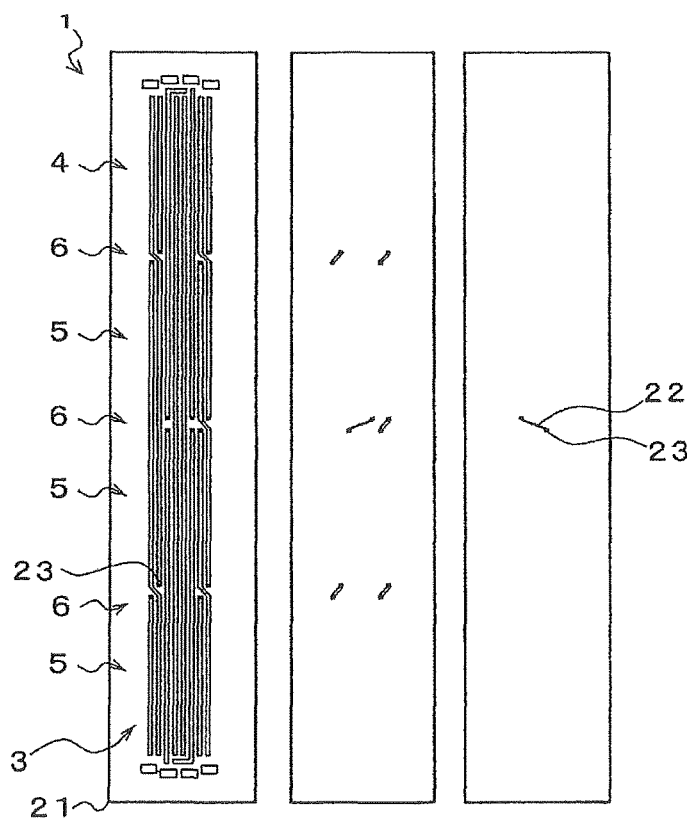
FIG. 22B is a schematic diagram showing an example of a wiring pattern as a transmission line formed on each layer of a circuit board in the communication device.
Figure 23A:
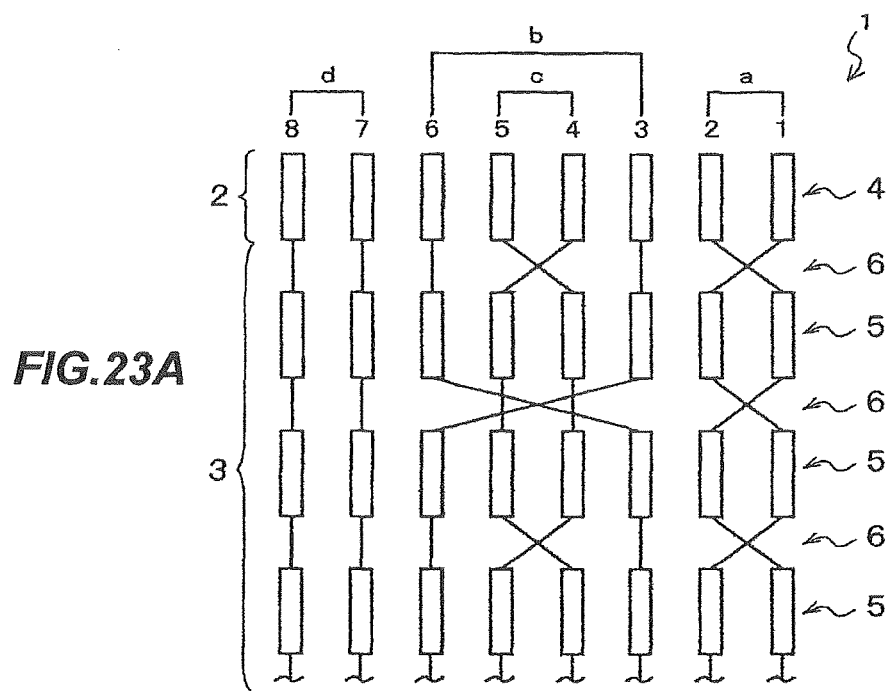
FIG. 23A is an illustration diagram showing a configuration of a transmission line nearby a connector in a communication device in a modified embodiment according to the invention.
Figure 23B:
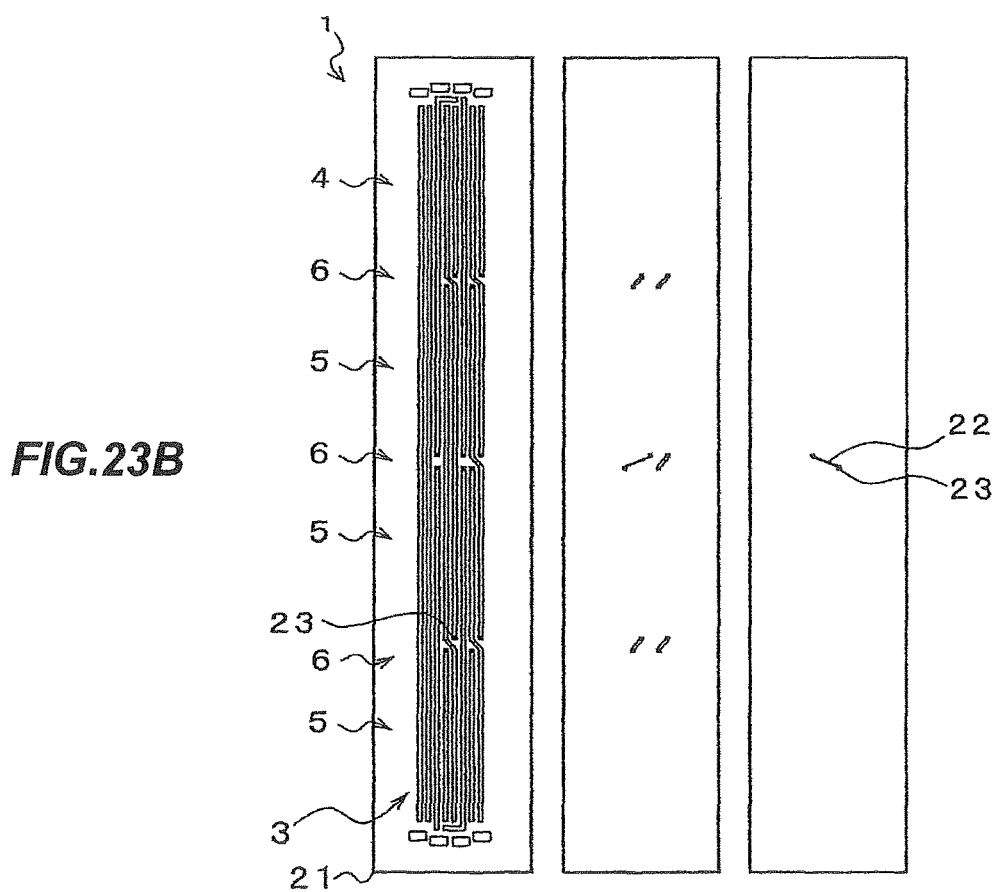
FIG. 23B is a schematic diagram showing an example of a wiring pattern as a transmission line formed on each layer of a circuit board in the communication device.
Figure 24A:
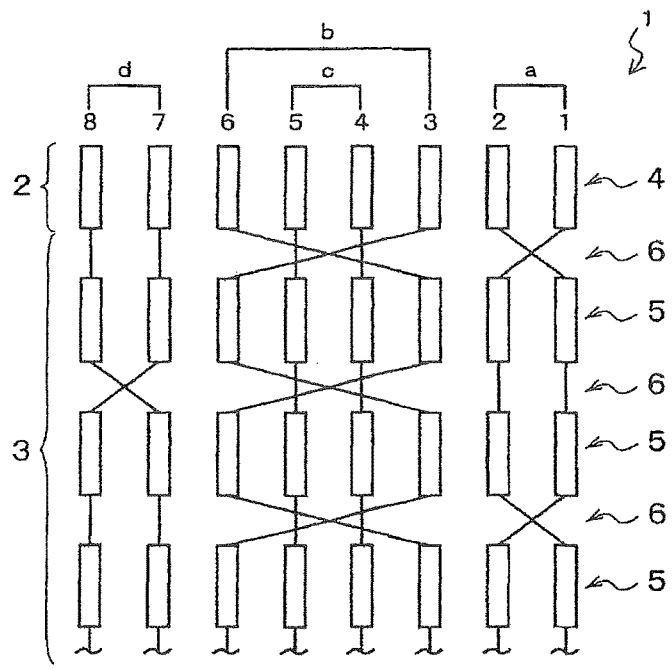
FIG. 24A is an illustration diagram showing a configuration of a transmission line nearby a connector in a communication device in a modified embodiment according to the invention.
Figure 24B:
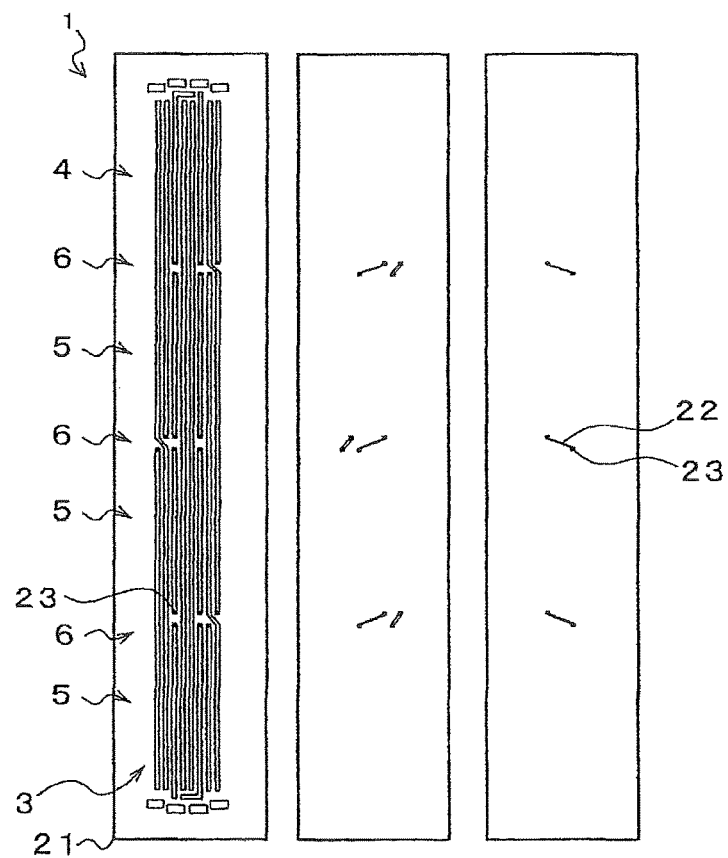
FIG. 24B is a schematic diagram showing an example of a wiring pattern as a transmission line formed on each layer of a circuit board in the communication device.
Figure 25A:
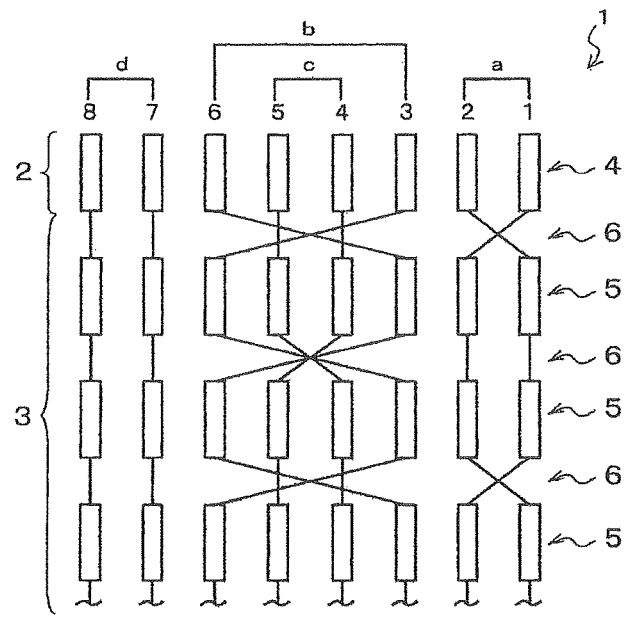
FIG. 25A is an illustration diagram showing a configuration of a transmission line nearby a connector in a communication device in a modified embodiment according to the invention.
Figure 25B:
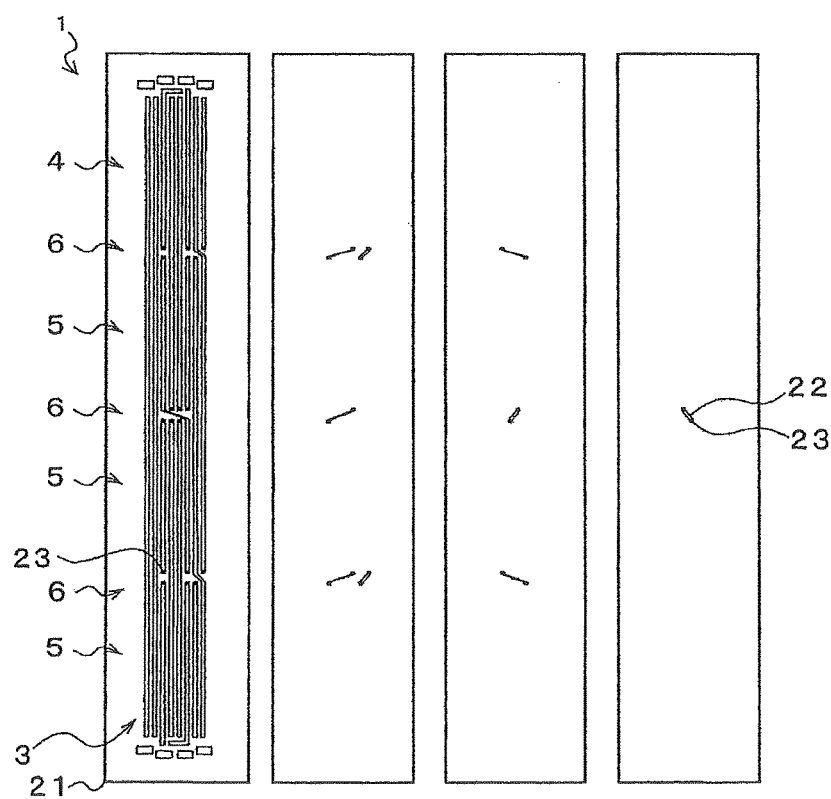
FIG. 25B is a schematic diagram showing an example of a wiring pattern as a transmission line formed on each layer of a circuit board in the communication device.
Figure 26A:
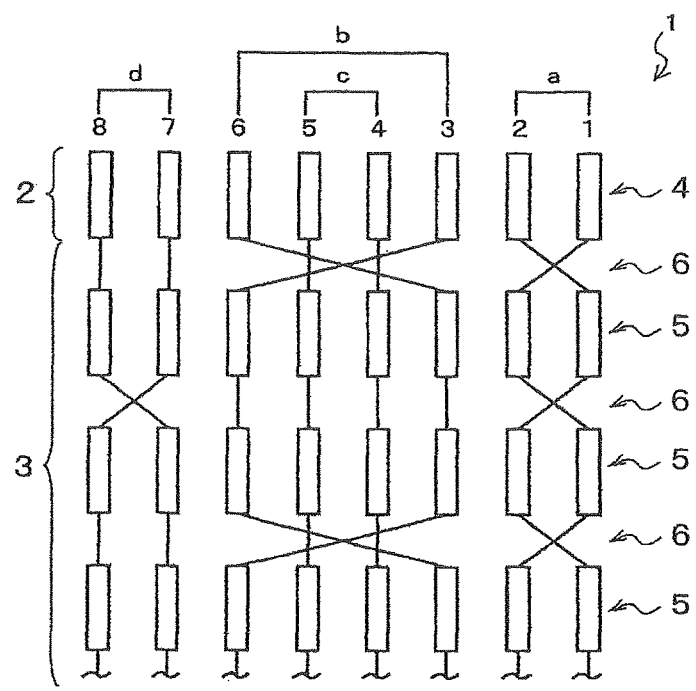
FIG. 26A is an illustration diagram showing a configuration of a transmission line nearby a connector in a communication device in a modified embodiment according to the invention.
Figure 26B:
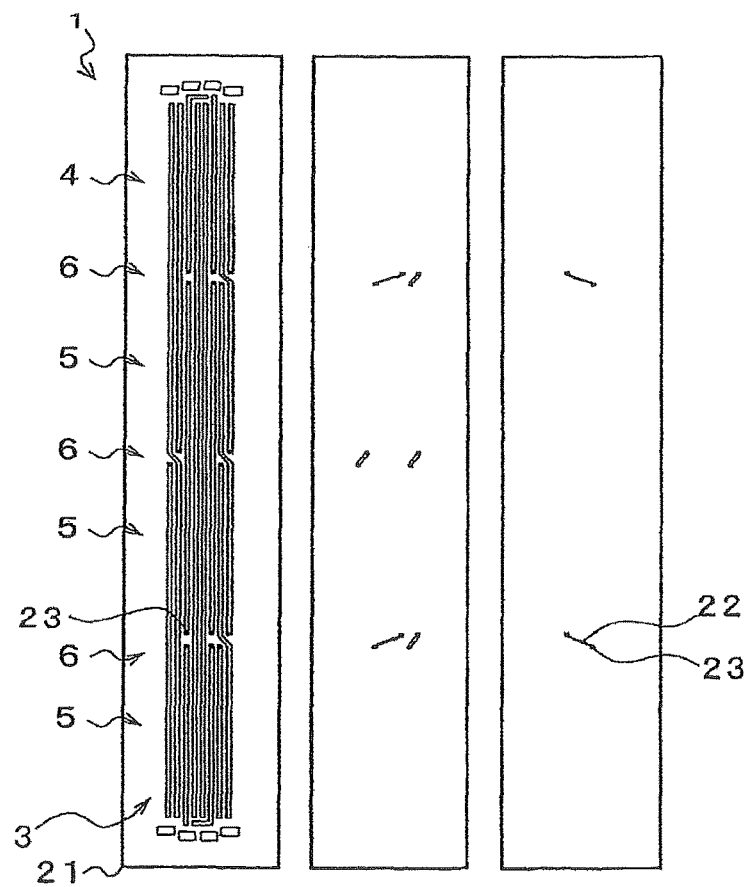
FIG. 26B is a schematic diagram showing an example of a wiring pattern as a transmission line formed on each layer of a circuit board in the communication device.
Figure 27A:
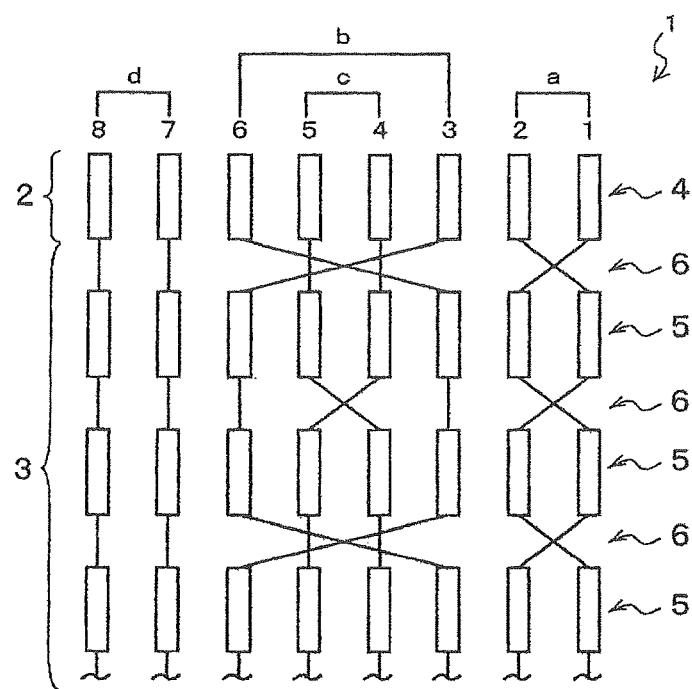
FIG. 27A is an illustration diagram showing a configuration of a transmission line nearby a connector in a communication device in a modified embodiment according to the invention.
Figure 27B:
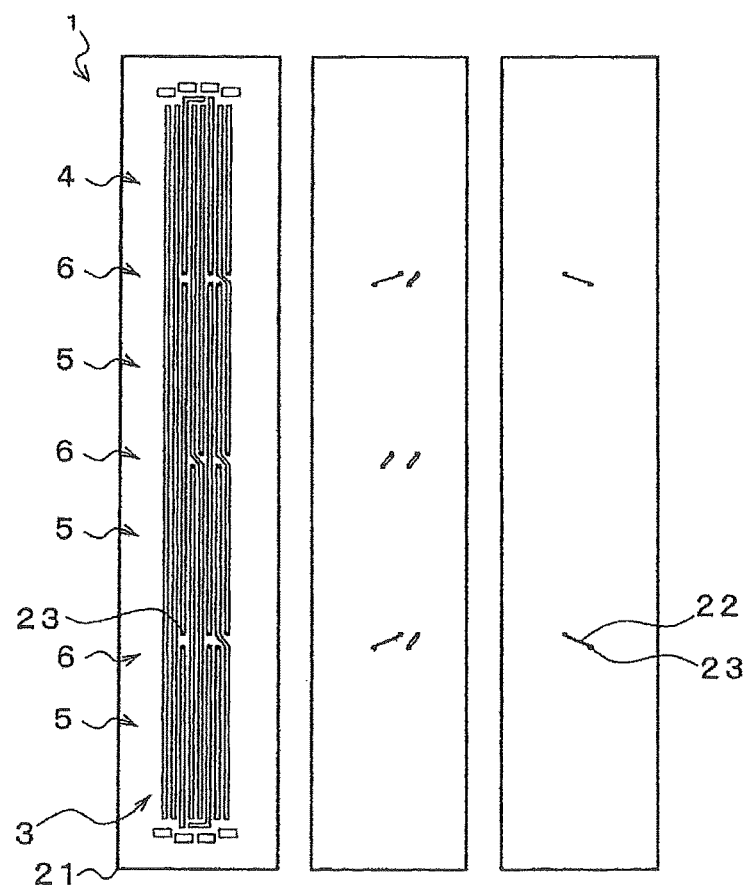
FIG. 27B is a schematic diagram showing an example of a wiring pattern as a transmission line formed on each layer of a circuit board in the communication device.

As shown in FIG. 5A and FIG. 5B, the communication device 1 according to the invention improves the FEXT and the NEXT and decreases the crosstalk compared with the conventional communication device 41.

Further, the number of the cross connection in Pair a to d are not limited thereto shown in FIGS. 1A, 1B or FIGS. 3A, 3B, may be appropriately chosen, it may be configured to likewise shown in FIG. 6A to 27B. Table 1 described below shows the number of the cross connection of each Pair a to d in FIGS. 1A, 1B, FIGS. 3A, 3B, and FIGS. 6A to 27B and a number of layers of the circuit board to be needed to arrange wires.

TABLE 1

| FIG. No. | number of cross connection | | | | number of layers needed for wiring |
|---|---|---|---|---|---|
| | Pair a | Pair b | Pair c | Pair d | |
| 1 | 1 | 0 | 2 | 3 | 2 |
| 3 | 1 | 0 | 3 | 2 | 2 |
| 6 | 0 | 1 | 2 | 3 | 3 |
| 7 | 0 | 1 | 3 | 2 | 4 |
| 8 | 0 | 2 | 1 | 3 | 3 |
| 9 | 0 | 2 | 3 | 1 | 4 |
| 10 | 2 | 0 | 1 | 3 | 2 |
| 11 | 2 | 0 | 3 | 1 | 2 |
| 12 | 0 | 3 | 1 | 2 | 4 |
| 13 | 0 | 3 | 2 | 1 | 4 |
| 14 | 3 | 0 | 1 | 2 | 2 |

TABLE 1-continued

| FIG. No. | number of cross connection | | | | number of layers needed for wiring |
|---|---|---|---|---|---|
| | Pair a | Pair b | Pair c | Pair d | |
| 15 | 3 | 0 | 2 | 1 | 2 |
| 16 | 1 | 2 | 0 | 3 | 3 |
| 17 | 1 | 2 | 3 | 0 | 4 |
| 18 | 2 | 1 | 0 | 3 | 3 |
| 19 | 2 | 1 | 3 | 0 | 4 |
| 20 | 1 | 3 | 0 | 2 | 3 |
| 21 | 1 | 3 | 2 | 0 | 4 |
| 22 | 3 | 1 | 0 | 2 | 3 |
| 23 | 3 | 1 | 2 | 0 | 3 |
| 24 | 2 | 3 | 0 | 1 | 3 |
| 25 | 2 | 3 | 1 | 0 | 4 |
| 26 | 3 | 2 | 0 | 1 | 3 |
| 27 | 3 | 2 | 1 | 0 | 3 |

As shown in Table 1 and FIG. 7A, FIG. 9A, FIG. 12A, FIG. 13A, FIG. 17A, FIG. 19A, FIG. 21A and FIG. 25A, in the case which Pair b and Pair c have the cross connections in a same stage connecting portion 6, at least four layers in the circuit board 21 are needed to wire the connecting portion 6. As the number of the layers of the circuit board increase, a cost to produce the circuit board 21 increase, it is preferred not to configure the cross connection in Pair b (a pair composed by number 3 and number 6 transmission lines 3) and Pair c (a pair composed by number 4 and number 5 transmission lines 3) in the same stage connecting portion 6.

As shown in Table 1 and FIG. 1A, FIG. 3A, FIG. 10A, FIG. 11A, FIG. 14A and FIG. 15A, configured the number of the cross connection in Pair b is zero, the number of the layers which is needed to arrange the wire for the connecting portion 6 makes possible to be two layers as the smallest. As a result, all of the connecting portion 6 in Pair b (the pair composed by number 3 and number 6 transmission lines 3) is preferable to be the straight connection.

In this case, it is explained in the case of the embodiment having the four pairs of the transmission line 3, generally in a planar configuration, a number of the layers needed for wiring can be decreased by choosing the pairs to make the cross connection in ascending order of a number of lines in the other pair between the pair.

Further, although it is not described, improving crosstalk compared with the conventional communication device 41 by all of the communication devices shown in FIG. 6A to 27B is confirmed.

Figure 28:
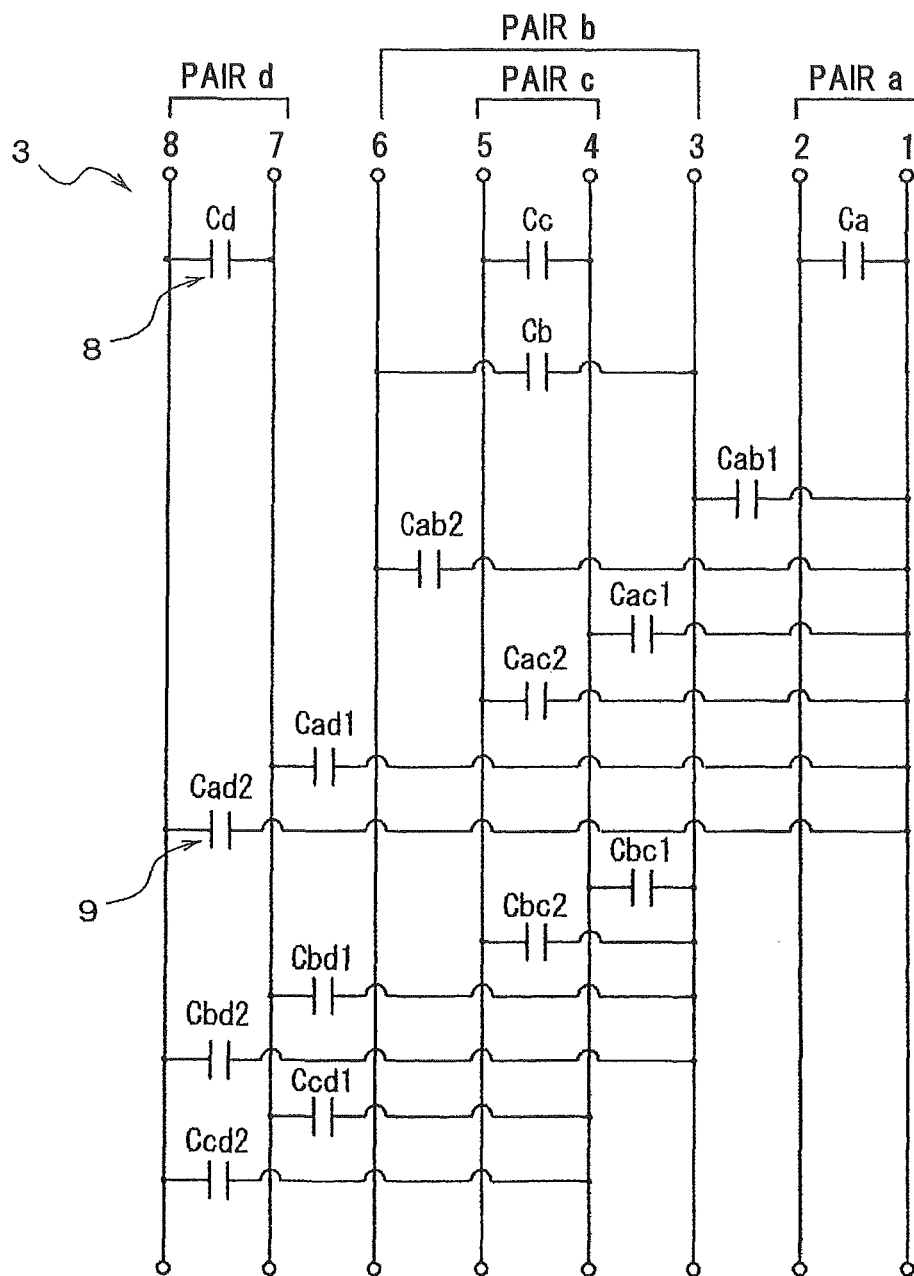
FIG. 28 is an illustration diagram showing a configuration of a transmission line arranged a capacitive element between transmission lines in the invention.

Furthermore, shown in FIG. 28, a capacitor 8 to align impedance can be arranged additionally between the two transmission lines 3 configuring a pair.

In FIG. 28, the capacitor 8 is arranged between number 1 and number 2 transmission lines 3 composing Pair a as Ca, between number 3 and number 6 transmission lines 3 composing Pair b as Cb, between number 4 and number 5 transmission lines 3 composing Pair c as Cc, between number 7 and number 8 transmission lines 3 composing Pair d as Cd.

Furthermore, a capacitor to align the crosstalk may be additionally provided between the pairs of the transmission lines 3.

In FIG. 28, the capacitors 9 are provided between number 1 and number 3 transmission lines 3 as Cab1 and number 1 and number 6 transmission lines 3 as Cab2, with respect to between Pair a and Pair b, between number 1 and number 4 transmission lines 3 as Cac1 and number 1 and number 5 transmission lines 3 as Cac2, with respect to between Pair a and Pair c, between number 1 and number 7 transmission lines 3 as Cad1 and number 1 and number 8 transmission lines 3 as Cad2, with respect to between Pair a and Pair d. In addition, the capacitors 9 are provided between number 3 and number 4 transmission lines 3 as Cbc1, and number 3 and number 5 of the transmission lines 3 as Cbc2, with respect to between Pair b and Pair c. The capacitors 9 are provided between number 3 and number 7 transmission lines 3 as Cbd1, and number 3 and number 8 transmission lines 3 as Cbd2, with respect to between Pair b and Pair d. The capacitors 9 are provided between number 4 and number 7 transmission lines 3 as Ccd1, and number 4 and number 8 transmission lines 3 as Ccd2, with respect to between Pair c and Pair d.

By rectifying the electrostatic capacity in the capacitors 9 (Cab1 to Ccd2), the crosstalk between Pairs can be adjusted.

As described above, in the communication device 1 of the embodiment, a number of the pairs of transmission lines 3 is N (N is even number), each pair of the transmission lines 3 comprises (N−1) stages of the sub-transmission lines 5 generating a same amount of crosstalk as that caused at the connector 2, and (N−1) stages of the connecting portions 6 comprise the first stage connecting portion 6 to connect a transmission path of the connector 2 and the first stage sub-transmission line 5 by the straight/cross connection, and second to (N−1) th stage connecting portions 6 to connect an i (i=1 to N−2) th stage sub-transmission line 5 and an (i+1) th stage sub-transmission line 5 by the straight/cross connection, wherein each pair of the transmission lines 3 is different in all pairs in a number of the connecting portion 6 having the cross connection and as a j (j=an integer by 1 to N/2) th stage connecting portion 6 in any one pair of the transmission lines 3 has cross connection, a (N−j) th stage connecting portion 6 in the any one pair of the transmission lines 3 also has cross connection.

By configuring thus, as shown in FIGS. 5A, 5B, the crosstalk caused at the connector 2 can be decreased as compared with the conventional device.

The invention according to claims is not to be limited to the above-mentioned embodiment, also the various kind of modifications can be implemented without departing from the gist of the invention.

What is claimed is:
1. A communication device, comprising:
   a connector connected to a communication cable including multiple pairs of signal lines for transmitting a differential signal; and
   a plurality of pairs of transmission lines for transmitting the differential signal inputted/outputted through the connector,
   wherein a number of the pairs of the transmission lines is an even number N that is greater than 2, each pair of the transmission lines comprises N−1 stages of sub-transmission lines generating a same amount of crosstalk as an amount of crosstalk caused at the connector, and N−1 stages of connecting portions comprising a first stage connecting portion to connect a transmission path of the connector and a first stage of the N−1 stages of sub-transmission lines by a corresponding straight or cross type connection, and second to N−1 th stage connecting portions to connect an i th stage of the N−1 stages of sub-transmission lines and an i+1 th stage of the N−1 stages of sub-transmission lines by a corresponding straight or cross type connection, where i=an integer from 1 to N−2, and wherein each pair of transmission lines has a different number of the connecting portions having the cross connection, and as a j th stage of the N−1 connecting portions in any one pair of the plurality of the pairs of transmission lines has a cross connection, a j th stage of the N−1 connecting portions in any other pair of the transmission lines also has a cross connection, where j=an integer from 1 to N/2.

2. The communication device according to claim 1, wherein the number of the pairs of the transmission lines N is four, the four pairs of the transmission lines comprise three stages of the sub-transmission lines N−1 and three stages of the connecting portions N−1, a first pair of the transmission lines has straight connection at all of the connecting portions, a second pair of the transmission lines has the cross connection at the second stage connecting portion and the straight connection at the first and the third stage connecting portion, a third pair of the transmission lines has the cross connection at the first and the third stage connecting portions and the straight connection at the second stage connecting portion, and a fourth pair of the transmission lines has the cross connection at all of the connecting portions.

3. The communication device according to claim 2, wherein the four pairs of the transmission lines comprise number 1 and number 2 transmission lines, number 3 and number 6 transmission lines, number 4 and number 5 transmission lines, and number 7 and number 8 transmission lines, respectively, and wherein the pair of number 3 and number 6 transmission lines and the pair of number 4 and number 5 transmission lines are configured so as not to make the cross connection at a same stage connecting portion.

4. The communication device according to claim 3, wherein the pair of number 3 and number 6 transmission lines comprises a straight connection at all of the connecting portions.

5. The communication device, according to claim 1, further comprising a capacitance element to adjust an impedance between two transmission lines of one of the pairs.

6. The communication device, according to claim 1, further comprising a capacitance element to rectify a crosstalk between two of the pairs of the transmission lines.

7. The communication device according to claim 1, comprising:
   two connectors each comprising the connector;
   a circuit board mounting the two connectors; and
   the plurality of pairs of the transmission lines formed on the circuit board and connecting said each of electrodes correspond to the two connectors,
   wherein the pairs of the transmission lines comprise the sub-transmission line and the connecting portion corresponding to the two connectors, respectively.

* * * * *